(12) United States Patent
Kumai et al.

(10) Patent No.: US 10,056,517 B2
(45) Date of Patent: Aug. 21, 2018

(54) METAL FOIL PATTERN LAYERED BODY, METAL FOIL LAYERED BODY, METAL FOIL MULTI-LAYER SUBSTRATE, SOLAR CELL MODULE, AND METHOD OF MANUFACTURING METAL FOIL PATTERN LAYERED BODY

(71) Applicant: DSM IP ASSETS B.V., Heerlen (NL)

(72) Inventors: Koichi Kumai, Tokyo (JP); Ryuji Ueda, Tokyo (JP); Takao Tomono, Tokyo (JP); Takehito Tsukamoto, Tokyo (JP)

(73) Assignee: DSM IP ASSETS B.V., Heerlen (NL)

( * ) Notice: Subject to any disclaimer, the term of this patent is extended or adjusted under 35 U.S.C. 154(b) by 0 days.

(21) Appl. No.: 14/098,020

(22) Filed: Dec. 5, 2013

(65) Prior Publication Data

US 2014/0090698 A1 Apr. 3, 2014

Related U.S. Application Data

(63) Continuation of application No. PCT/JP2012/064594, filed on Jun. 6, 2012.

(30) Foreign Application Priority Data

Jun. 6, 2011 (JP) .................................. 2011-126516
Jun. 6, 2011 (JP) .................................. 2011-126517

(Continued)

(51) Int. Cl.
*H01L 31/05* (2014.01)
*H05K 3/20* (2006.01)

(Continued)

(52) U.S. Cl.
CPC ......... *H01L 31/0516* (2013.01); *H05K 3/041* (2013.01); *H05K 3/20* (2013.01);

(Continued)

(58) Field of Classification Search
CPC ............... H01L 31/0516; H01L 31/049; H01L 31/0508
See application file for complete search history.

(56) References Cited

U.S. PATENT DOCUMENTS 6,308,406 B1   10/2001  Gill et al.
2009/0032081 A1*  2/2009  Saita ............... H01L 31/022425
                                                      136/244

(Continued)

FOREIGN PATENT DOCUMENTS

EP      1 744 607 A1    1/2007
EP      2 642 838 A1    9/2013

(Continued)

OTHER PUBLICATIONS

International Search Report dated Sep. 25, 2012 in corresponding International Application No. PCT/JP2012/064594.

(Continued)

*Primary Examiner* — Bethany L Martin
(74) *Attorney, Agent, or Firm* — Nixon & Vanderhye P.C.

(57) ABSTRACT

A metal foil pattern layered body of the invention includes: a base member; a metal foil including a metal foil pattern formed by an opening and a metal portion; and a protuberance provided at the metal foil and at a boundary between the opening and the metal portion.

12 Claims, 16 Drawing Sheets

(30) Foreign Application Priority Data

Jun. 6, 2011 (JP) ................................ 2011-126518
Jun. 6, 2011 (JP) ................................ 2011-126520

(51) Int. Cl.
*H05K 3/04* (2006.01)
*H05K 1/02* (2006.01)
*H05K 3/28* (2006.01)
*H05K 3/34* (2006.01)

(52) U.S. Cl.
CPC ........... *H05K 3/284* (2013.01); *H05K 3/3431* (2013.01); *H05K 2201/0195* (2013.01); *H05K 2201/10143* (2013.01); *H05K 2203/0108* (2013.01); *Y02E 10/50* (2013.01); *Y10T 29/301* (2015.01)

(56) References Cited

U.S. PATENT DOCUMENTS

2010/0051701 A1   3/2010   Ogata et al.
2011/0083716 A1*  4/2011   Meakin et al. ............... 136/244
2012/0012180 A1*  1/2012   Abiko ........................... 136/256

FOREIGN PATENT DOCUMENTS

| JP | 55-24277 | | 6/1980 | |
| JP | 3116209 | | 12/2000 | |
| JP | 2001-101366 | | 4/2001 | |
| JP | 2001101366 | * | 4/2001 | ............... H01Q 1/38 |
| JP | 2005-11869 | | 1/2005 | |
| JP | 2007-76288 | | 3/2007 | |
| JP | 2009-111122 | | 5/2009 | |
| JP | WO201011083 | * | 9/2010 | ........... H01L 31/042 |
| JP | 2010-252298 | | 11/2010 | |
| WO | WO 2012/067225 A1 | | 5/2012 | |

OTHER PUBLICATIONS

European Search Report dated Jul. 30, 2015 in corresponding European Patent Application No. 12796975.6.

\* cited by examiner

METAL FOIL PATTERN LAYERED BODY, METAL FOIL LAYERED BODY, METAL FOIL MULTI-LAYER SUBSTRATE, SOLAR CELL MODULE, AND METHOD OF MANUFACTURING METAL FOIL PATTERN LAYERED BODY

CROSS REFERENCE TO RELATED APPLICATIONS

This application is a continuation application based on a PCT Patent Application No. PCT/JP2012/064594, filed Jun. 6, 2012, whose priority is claimed on Japanese Patent Application No. 2011-126516 filed on Jun. 6, 2011, Japanese Patent Application No. 2011-126517 filed on Jun. 6, 2011, Japanese Patent Application No. 2011-126518 filed on Jun. 6, 2011, and Japanese Patent Application No. 2011-126520 filed on Jun. 6, 2011, the contents of which are hereby incorporated by reference in their entirety.

BACKGROUND OF THE INVENTION

Field of the Invention

The present invention relates to a metal foil pattern layered body, a metal foil layered body, a metal foil multi-layer substrate, solar a cell module, and a method of manufacturing a metal foil pattern layered body.

Particularly, the present invention relates to a metal foil pattern layered body used to electrically connect so-called back contact solar cells to each other, and a solar cell module using the metal foil pattern layered body.

Additionally, the present invention relates to: a metal foil pattern layered body including a metal foil on which electroconductive patterns including a wiring pattern, a circuit pattern, or the like are provided, an insulating layer, and a base member on which they are layered; and a solar cell module in which a solar cell is provided on and sealed by the metal foil pattern layered body.

Moreover, the present invention relates to: a metal foil layered body in which a metal foil having a wiring pattern is stacked on a base member; and a solar cell module in which a solar cell is connected to and sealed by a metal foil layered body.

Description of the Related Art

In recent years, the spread of photovoltaic power generation, that is a power generation system utilizing natural energy, rapidly proceeds.

As shown in FIG. 27, a solar cell module generating photovoltaic power includes: a light-transmissive substrate 502 disposed on a surface to which light is incident; a back sheet 501 disposed on the back face side located on the opposite side of the light incidence surface; and a plurality of solar cells 503 disposed between the light-transmissive substrate 502 and the back sheet 501.

In addition, the solar cells 503 are sandwiched and sealed between a seal member 504 made of an ethylene-vinyl acetate copolymer (EVA) film or the like.

Conventionally, in a solar cell module, a plurality of solar cells 503 are electrically connected in series to wiring members 505 having a width of 1 to 3 mm.

The solar cell 503 has a structure in which a negative electrode (N-type semiconducting electrode) is provided on a top face side serving as a light-receiving face of sunlight and in which a positive electrode (P-type semiconducting electrode) is provided on the back face side.

Consequently, when the solar cells 503 adjacent to each other are connected through the wiring members 505, the wiring members 505 overlap the light-receiving face of the solar cell 503, and the area efficiency of photoelectric conversion thereby tends to be degraded.

Accordingly, in response to this, for example, Japanese Unexamined Patent Application, First Publication No. 2009-111122 proposes a back contact solar cell in which both a positive electrode and a negative electrode are provided on the back face of a solar cell, and the electrodes are electrically connected to each other through a circuit layer provided on a substrate.

The solar cell employing this system can connect a plurality of solar cells in series on the back face of the cell, the light-receiving area of the top face of the cell does not sacrifice, it is possible to prevent the area efficiency of photoelectric conversion from being degraded.

Additionally, a plurality of the solar cells are electrically connected through to a metal foil pattern layered body which is placed at the back face side of the solar cells.

That is, the metal foil pattern layered body forms a layered structure in which a metal foil pattern is formed on a base member, and the solar cells are electrically connected to each other as a result of using the metal foil pattern as a circuit layer.

As a technique of forming the metal foil pattern in the above-described metal foil pattern layered body, a chemical-milling by etching have been used.

In this technique, a resist material or the like having etch resistance are patterned on a metal foil, thereafter, immersion in an etching solution or the like is carried out, as a result, a part of the metal foil at which the resist material is not formed can be removed.

In contrast, in this technique, patterning of the resist material is necessary, there is a problem in that the patterning of the resist material is difficult in accordance with a large-scaled metal foil.

Additionally, since a large amount of etching solution for chemically milling a metal foil is used, installation of a facility required for processing the etching solution and a large amount of cost required for environmental measures or the like are necessary.

As another technique of patterning a metal foil in order to solve the above-mentioned problem, for example, a punching process with a blade of a die as disclosed in Japanese Patent No. 3116209 have been developed.

Depending on the types of die, there is a difference in durability, shape accuracy, and a machining area; however, in recent years, on demand for improvement of the degree of precision and increase in area of a die, it is possible to carry out microscopical patterning such as approximately several hundreds of μm.

Additionally, not only the conventional solar cell module shown in FIG. 27, a solar cell module provided with bilayer seal films has also been conventionally known.

Specifically, such solar cell module shown in FIG. 28 includes: a light-transmissive substrate 620 disposed on a face to which light is incident; a solar cell module base member 610 (back sheet) disposed on a back face side located on a side opposite to the light incidence surface; and a plurality of solar cells 630 sealed between the light-transmissive substrate 620 and the solar cell module base member 610.

Moreover, the solar cells 630 is sealed and sandwiched between seal films 640a and 640b formed of an ethylene-vinyl acetate copolymer (EVA) film or the like.

Conventionally, in a solar cell module, a plurality of solar cells 630 are electrically connected in series to wiring members 650.

The solar cell 630 has a structure in which a negative electrode 631 is provided on a top face side serving as a light-receiving face 630a of sunlight and a positive electrode 632 is provided on the back face side.

Consequently, when the solar cells 630 adjacent to each other are connected through the wiring members 650, the wiring members 650 overlap the light-receiving face 630a of the solar cell 630, and there is a drawback in that the area efficiency of photoelectric conversion is degraded.

In addition, according to the arrangement of the aforementioned electrodes 631 and 632, since the solar cell module has a structure in which the wiring members 650 come around behind the solar cells 630 from the upper side thereof, there is a concern that the wiring members 650 are broken as a result of a difference in the coefficient of thermal expansion between parts constituting the solar cell module.

Consequently, Japanese Unexamined Patent Application, First Publication No. 2009-111122 and Japanese Unexamined Patent Application, First Publication No. 2005-11869 propose a back contact solar cell in which both a positive electrode and a negative electrode are provided on the back face of the cell.

The solar cell employing this system can connect a plurality of solar cells in series on the back face of the cell, the light-receiving area of the top face of the cell does not sacrifice, it is possible to prevent a reduction in the light receiving efficiency and the area efficiency of photoelectric conversion.

Furthermore, since it is not necessary to adopt the structure in which the wiring members come around behind the solar cells from the upper side thereof, it is also possible to prevent breaking of the wiring members which is due to a difference in the coefficient of thermal expansion between parts forming the solar cell module.

Regarding the above-described solar cell modules, components may be placed on the market, which is formed by coating (lamination) a solar cell back sheet with a layered body that is coated with a metal foil having a circuit pattern (wiring pattern) used to connect solar cells to a top face of an insulating base member with an adhesive layer interposed therebetween.

For example, in a back sheet 610 which is used as a solar cell module base member shown in FIG. 29, a layered body is stacked on the top face of the back sheet 610, and the layered body is configured by adhesively attaching a metal foil 603 having a circuit pattern formed thereon to a base member 601 with an adhesive layer 602 interposed therebetween.

Regarding this layered body, when the circuit pattern is formed on the metal foil 603, a photoresist is applied on a sheet-shaped metal foil 603, a mask having the same pattern as the circuit pattern is mounted on an exposure apparatus, and exposure is carried out.

Thereafter, unnecessary resist is removed, etching through the resist pattern provided on the metal foil 603 is carried out, and a predetermined circuit pattern is thereby formed on the metal foil 603.

In the circuit pattern of the resultant metal foil 603 in this manner, as shown in FIG. 29, the edge face of the metal foil 603 is perpendicularly cut off by etching.

Additionally, as a metal foil pattern layered body forming a circuit pattern serving as an electroconductive pattern, a constitution has been proposed as disclosed in Japanese Unexamined Patent Application, First Publication No. 2007-76288.

The metal foil pattern layered body is a metal foil sheet in which an adhesive layer and a metal foil are stacked in layers on a top face of the base member, a metal foil is punched with a heated punching blade, unnecessary portions are removed, a circuit pattern of the temporarily-fixed metal foil is thermal-pressure bonded to the base member by use of a die or the like, and a metal foil pattern layered body is thereby formed.

In this manner, the metal foil sheet is utilized, for example, to manufacture of an antenna of an integrated circuit tag.

In this case, the edge face of the metal foil having the circuit pattern is also vertically cut off with a punching blade as shown in FIG. 29.

Moreover, not only the above-described back sheet shown in FIG. 29, but also, for example, a back sheet FIG. 30 is known.

In a back sheet 610 which is used as a solar cell module base member shown in FIG. 30, a layered body 604 is stacked on the top face of the back sheet 610, and the layered body is configured by adhesively attaching a metal foil 603 having a wiring pattern 603a formed thereon to a base member 601 with an adhesive layer 602 interposed therebetween.

Regarding this layered body 604, when the wiring pattern 603a of the metal foil 603 is formed, a photoresist is applied on a sheet-shaped metal foil 603, a mask having the same pattern as the wiring pattern 603a is mounted on an exposure apparatus, and exposure is carried out.

Thereafter, unnecessary resist is removed, etching through the resist pattern provided on the metal foil 603 is carried out, and a predetermined wiring pattern 603a is thereby formed on the metal foil 603.

In the wiring pattern 603a of the resultant metal foil 603 in this manner, as shown in FIG. 30, the edge face of the metal foil 603 is perpendicularly cut off by etching.

Additionally, as a metal foil layered body having a wiring pattern, a constitution has been proposed as disclosed in Japanese Unexamined Patent Application, First Publication No. 2007-76288.

In the metal foil layered body, a metal foil is stacked in layers on a top face of the base member with an adhesive layer interposed therebetween, a metal foil is punched with a heated punching blade, unnecessary portions are removed, a wiring pattern of the temporarily-fixed metal foil is thermal-pressure bonded to the base member by use of a die or the like, and a metal foil pattern layered body is thereby formed.

In this manner, the metal foil layered body is utilized for manufacture of an antenna of an integrated circuit tag.

In this case, the edge face of the metal foil having the wiring pattern is also vertically cut off with a punching blade as shown in FIG. 30.

However, in the case of die-cutting the metal foil which is stacked on the base member with the adhesive layer interposed therebetween, it is necessary remove an unnecessary region, that is an unnecessary portion of the metal foil, from the adhesive layer after the die-cutting.

In the case where the unnecessary region of the metal foil is formed on the adhesive layer integrally with the adhesive layer, it is possible to continuously remove the unnecessary portion by, for example, winding up.

Furthermore, in the case of die-cutting the metal foil which is stacked on the base member with the adhesive layer interposed therebetween, it is necessary remove an unnecessary region, that is an unnecessary portion of the metal foil, from the adhesive layer after the die-cutting.

Moreover, it is thought that the metal foil pattern is removed from the base member due to aged deterioration, it is desired to further improve durability.

However, when the winding up is carried out, there is a concern that not only the unnecessary region of the metal foil but also a necessary region that is to be left as a metal foil pattern is removed.

Additionally, it is thought that the metal foil pattern is removed from the base member due to aged deterioration, it is desired to further improve durability.

In addition, when die-cutting is performed using a blade die, a cutting depth of the blade is suitably set; however, if the cutting edge of the blade does not reach the back face of the metal foil, it is not possible to reliably cut the metal foil.

On the other hand, if a cutting depth of the blade is excessively large, the cutting edge of the blade damages to the top face of the base member, product reliability is degraded.

For this reason, in order to avoid the base member from damage while reliably cutting the metal foil, it is necessary to strictly set a cutting depth to stop the cutting edge of the blade in the adhesive layer.

However, the thickness of the adhesive layer is thin such as approximately 10 μm, it is difficult to adjust the cutting depth.

Additionally, regarding the metal foil pattern layered bodies shown in FIGS. 28 and 29, in the case of forming a circuit pattern on the metal foil by etching, a large amount of chemical solutions or materials such as resists such as photoresists or the like, etching solution, remover for remaining resists, or the like is necessary, it is complicated, and the cost of manufacturing is high.

Furthermore, there is a defect that a metal foil or the like may be damaged due to use of chemical solutions such as etching solution, resist remover, or the like.

Moreover, in the case where a circuit pattern is manufactured by not only etching but also punching a metal foil with a punching blade, an edge face of the circuit pattern of the metal foil is formed vertical to the base member and, and there is a concern that the insulating layer is removed from the metal foil of circuit pattern when stacking an insulating layer on the circuit pattern. Therefore, the metal foil pattern layered body may be defective.

Furthermore, in the case where a solar cell module or the like is manufactured using the aforementioned metal foil pattern layered body, a constitution is employed in which a seal member is formed on the top face of the circuit pattern, the solar cells are packaged inside the seal member, and the electrodes provided on the back faces of the solar cells are connected to the circuit pattern.

Consequently, since the edge face of the circuit pattern of the metal foil is vertically formed, the seal member sealing the solar cells may be removed from the metal foil of the circuit pattern, and displacement of the seal member with respect to the metal foil of the circuit pattern may occur; contact failure between the electrode of the solar cell and the electrode of the circuit pattern, which is due to misalignment, may occur.

Additionally, regarding the metal foil layered bodies having the wiring pattern shown in FIGS. 28 and 30, in the case of forming a wiring pattern on the metal foil by etching, a large amount of chemical solutions or materials such as resists, etching solution, remover for remaining resists, or the like is necessary, it is complicated, and the cost of manufacturing is high.

Furthermore, after a wiring pattern is formed by etching, punching, or the like, the cross-sectional configuration of the edge face of the metal foil having the wiring pattern is a shape which is formed vertical to the base member.

Consequently, for example, as shown in FIG. 30, when electroconductive paste 600 such as solder or the like is mounted on the upper face of the metal foil 603 forming the wiring pattern 603*a*, thereafter, the electroconductive paste 600 is melt by heating and is connected to the electrodes or the like of the back faces of the solar cells, the high-temperature solder flows out from the upper face of the metal foil 603 toward adjacent wiring pattern 603*a*, there is a concern that the wiring patterns 603*a* are short-circuited.

SUMMARY OF THE INVENTION

The invention was made with respect to the above-described problems, and has an object to provide a metal foil pattern layered body, a solar cell module, and a method of manufacturing a metal foil pattern layered body, where a metal foil pattern is prevented from being removed, and it is possible to improve durability and to maintain a high level of product reliability.

Additionally, the invention has an object to provide a metal foil pattern layered body and a solar cell module provided with the metal foil pattern layered body, where a position of an insulating layer is not displaced from a metal foil having an electroconductive pattern, the insulating layer is not removed from metal foil, and it is possible to accurately mount the insulating layer on the metal foil.

Furthermore, the invention has an object to provide a metal foil layered body and a solar cell module provided with the metal foil layered body, where a molten electroconductive member does not flow out from a wiring pattern, and the electroconductive member can be accurately connected to an electrode or wiring of a member different from the electroconductive member.

In order to solve the aforementioned problems, the invention provides the aspects described below.

A metal foil pattern layered body of a first aspect of the invention includes: a base member; a metal foil including a metal foil pattern formed by an opening and a metal portion; and a protuberance provided at the metal foil and at a boundary between the opening and the metal portion.

The metal foil pattern layered body of the first aspect of the invention includes: an adhesive layer disposed above a top face of the base member, wherein the metal foil pattern is stacked in layers on the base member with the adhesive layer interposed therebetween, and the protuberance is bended toward the base member and formed in the adhesive layer.

The protuberance is a turn-up portion formed at an edge of a workpiece when a metal or the like is subjected to mechanical working such as, for example, burr.

In the metal foil pattern layered body of the first aspect of the invention, it is preferable that the adhesive layer be disposed on the top face of the base member, the metal foil pattern be stacked in layers on the base member with the adhesive layer interposed therebetween, and the adhesive layer be disposed on the top face of the base member.

It is preferable that the metal foil pattern layered body of the first aspect of the invention further include a buffer layer disposed between the base member and the adhesive layer, wherein the adhesive layer is disposed on the buffer layer, and the metal foil pattern is stacked in layers on the base member with the adhesive layer interposed therebetween, the adhesive layer being disposed on the buffer layer.

According to the metal foil pattern layered body of the first aspect of the invention, since burrs are formed to project to the adhesive layer and implanted thereinto, an anchor effect that is due to the burrs and the adhesive layer is thereby produced.

Accordingly, it is possible to tightly fix the metal foil pattern to the adhesive layer.

Furthermore, in a case where the buffer layer is formed between the base member and the adhesive layer, when the metal foil pattern is formed by cutting using a blade die, it is possible to avoid the blade from reaching the top face of the base member.

In the metal foil pattern layered body of the first aspect of the invention, it is preferable that the protuberance have an inclined surface extending toward the base member in a direction toward the edge of the metal foil pattern.

Because of this, the top surface of the metal foil pattern is illuminated with light, and the light can be reflected by the inclined surface.

Thus, in the case where a plurality of solar cells are electrically connected to each other with the metal foil pattern layered body at, for example, the back face side of the solar cells, light passes between the solar cells, the light reaches the inclined surface and is reflected, and the light can enter the solar cells.

As a result, it is possible to improve the light utilization efficiency.

In the metal foil pattern layered body of the first aspect of the invention, it is preferable that a cut portion be formed on the adhesive layer along the inclined surface.

Consequently, in the case where a coated layer formed of a material (the other material) different from the metal foil pattern layered body is stacked in layers on the top face of the metal foil pattern layered body, an anchor effect that is due to the coated layer and the adhesive layer is produced.

As a result, it is possible to firmly fix the coated layer to the adhesive layer.

In the metal foil pattern layered body of the first aspect of the invention, it is preferable that the cut portion be continuously formed at the adhesive layer and the base member.

Therefore, in the case where a coated layer formed of a material (the other material) different from the metal foil pattern layered body is stacked in layers on the top face of the metal foil pattern layered body, an anchor effect that is due to the coated layer and the base member is produced in addition to the anchor effect that is due to the coated layer and the adhesive layer.

As a result, it is possible to tightly fix the coated layer to the metal foil pattern layered body.

In the metal foil pattern layered body of the first aspect of the invention it is preferable that a cut portion be formed at the adhesive layer and the buffer layer along the inclined surface.

Accordingly, in the case where a coated layer formed of a material (the other material) different from the metal foil pattern layered body is stacked in layers on the top face side of the metal foil pattern layered body, an anchor effect that is due to the coated layer, the adhesive layer, and the buffer layer is produced.

For this reason, it is possible to tightly fix the coated layer to the adhesive layer.

In the metal foil pattern layered body of the first aspect of the invention, it is preferable that the buffer layer be a PET film.

Therefore, since the buffer layer can be inexpensively formed, improvement in cost reduction can be achieved.

A solar cell module of a second aspect of the invention includes: a plurality of solar cells; a seal layer sealing the solar cells and having a back face; and the metal foil pattern layered body of the above-described first aspect, disposed at the back face side of the seal layer, electrically connecting the solar cells to each other.

According to the solar cell module of the second aspect of the invention, since it is possible to firmly fix the metal foil pattern to the adhesive layer as a result of the anchor effect that is due to the burrs and the adhesive layer, durability can be improved.

Furthermore, in a case where the buffer layer is formed between the base member and the adhesive layer, when the metal foil pattern is formed by cutting using a blade die, it is possible to prevent the blade from reaching the top face of the base member.

As a result, it is possible to maintain a high level of product reliability of the solar cell module.

A method of manufacturing a metal foil pattern layered body of a third aspect of the invention includes: stacking a metal foil in layers on a base member with at least an adhesive layer interposed therebetween; allowing the front edge of the blade to reach at least the adhesive layer while cutting the metal foil by pressing a front edge of a blade onto the metal foil, thereby separating a necessary region of the metal foil from an unnecessary region; and forming a metal foil pattern on the necessary region by removing the metal foil formed at the unnecessary region.

In the method of manufacturing a metal foil pattern layered body of the third aspect of the invention, it is preferable that, when the metal foil is stacked in layers on the base member, the adhesive layer be stacked in layers on a top face of the base member, and the metal foil pattern be stacked in layers on the base member with the adhesive layer interposed therebetween, the adhesive layer being disposed on the top face of the base member.

In the method of manufacturing a metal foil pattern layered body of the third aspect of the invention, it is preferable that, when the metal foil is stacked in layers on the base member, a buffer layer, the adhesive layer, and the metal foil be sequentially stacked in layers on a top face of the base member.

According to the method of manufacturing the metal foil pattern of the third aspect of the invention, since the cutting edge of the blade reaches at least the adhesive layer, the edge of the metal foil becoming the cutting portion that is cut by the blade projects to the base member, that is, projects to the inside of the adhesive layer.

This means that the edge of the metal foil becomes burrs.

Consequently, it is possible to tightly fix the metal foil pattern to the adhesive layer as a result of the anchor effect that is due to the burrs and the adhesive layer.

In addition, in a case where the buffer layer is provided between the adhesive layer and the base member, it is possible to avoid the cutting edge of the blade from reaching the top face of the base member.

A metal foil pattern layered body of a fourth aspect of the invention includes: a base member; an adhesive layer provided on one face of the base member; a metal foil having an electroconductive pattern and an inclined edge face, the electroconductive pattern being placed on the base member with the adhesive layer interposed therebetween, the inclined edge face having an inverse tapered shape; and an insulating layer coating the metal foil.

In the metal foil pattern layered body of the fourth aspect of the invention, the edge face of the metal foil is inclined so as to have an inverse tapered shape, the insulating layer fills the metal foil pattern layered body so as to be attached firmly to the edge face, and the insulating layer is stacked in layers on the metal foil so as to cover this.

Consequently, the metal foil edge face formed in an inverse tapered shape fits onto the insulating layer, it is possible to reliably prevent the insulating layer from being removed from the metal foil and from being displaced due to impact or the like in a lateral direction.

A metal foil pattern layered body of a fifth aspect of the invention configures the aforementioned metal foil pattern layered body of the first aspect, and includes: an adhesive layer provided on one face of the base member; and an insulating layer coating the metal foil, wherein the metal foil pattern is an electroconductive pattern provided on the base member with the adhesive layer interposed therebetween, the metal foil has an inclined edge face having an inverse tapered shape, and the protuberance is provided at the edge face and projects to the insulating layer.

In the metal foil pattern layered body of the fifth aspect of the invention, the edge face of the metal foil is inclined so as to have an inverse tapered shape, and the protuberances protrude from the edge face toward the insulating layer.

For this reason, the insulating layer is attached firmly to and fits onto the metal foil edge face having an inverse tapered shape, the protuberances project to the insulating layer, an anchor effect is produced, and it is possible to reliably prevent the insulating layer from being removed from the metal foil and from being displaced due to impact or the like in a lateral direction.

In the metal foil pattern layered body of the fifth aspect of the invention, it is preferable that a cross-sectional shape of the protuberance be substantially triangular, and the protuberance protrude from the edge face on an extension of the edge face of the metal foil.

Since the cross-sectional shape of the protuberance is substantially triangular and the protuberance and the protuberance projects so as to impale the insulating layer on an extension of the edge face of the metal foil, an anchor effect is produced.

In the metal foil pattern layered body of the fourth aspect and the fifth aspect of the invention, it is preferable that an inclination angle of the edge face of the metal foil with respect to the base member be in the range of 55° to 85°.

As long as the inclination angle ($\alpha$) of the inverse tapered shape of the edge face of the metal foil is in the range of 55° to 85°, the insulating layer is closely-attached between gaps provided at the edge faces of the metal foil and fills the gaps, and it is possible to prevent the insulating layer from being removed from the metal foil.

On the other hand, if the inclined angle of the edge face is less than 55°, a tool angle of the cutting blade for cutting the metal foil during forming of the metal foil becomes too large to smoothly cut this.

Furthermore, if the inclined angle of the edge face is greater than 85°, the inclined angle is close to the right angle, therefore, there is a defect that the insulating layer is likely to be removed.

In the metal foil pattern layered body of the fourth aspect and the fifth aspect of the invention, it is preferable that a vertex angle of the protuberance be greater than 0° and less than or equal to 45°, and where a thickness of the metal foil is represented as d, a height from a surface on a side opposite to the face of the metal foil adhered to the adhesive layer be greater than 0 and less than or equal to 0.5 d.

Since the vertex angle ($\beta$) of the protuberance is in the range of 0° to 45°, an anchor effect with respect to the insulating layer is produced, a high level of resistance against the removal of the insulating layer is obtained, and an excellent effect is obtained that prevents displacement of the position of the insulating layer from the position of the metal foil in the lateral direction which is due to impact in a lateral direction.

Moreover, where the film thickness of the metal foil is defined as d, a height (h) of the protuberance from the top surface of the metal foil is in the range of greater than 0 to 0.5 d.

Accordingly, excellent anchor effect can be produced with respect to the insulating layer stacked in layers on the metal foil.

On the other hand, if a height (h) of the protuberance is less than or equal to 0, sufficient anchor effect or an effect of preventing the displacement in the lateral direction is not obtained.

Additionally, if a height (h) of the protuberance is greater than 0.5 d, it is difficult to form protuberances, the strength of protuberances is weak, and an effect of preventing removal of the insulating layer is not sufficiently obtained.

Furthermore, the anchor effect is also degraded.

Additionally, it is not necessary provide the protuberances on an extension of the edge face, in this case, it is possible to form the protuberances regardless of a height of the protuberance from the top surface of the metal foil.

A solar cell module of a sixth aspect of the invention includes: the metal foil pattern layered body of the fourth aspect and the fifth aspect, provided with a metal foil having a circuit pattern; a solar cell sealed inside the insulating layer; and a light-transmissive front plate stacked in layers on a face on the opposite side of the face of the insulating layer on which the metal foil is provided.

According to the solar cell module of the sixth aspect of the invention, it is possible to attach the insulating layer sealing the solar cells firmly to the edge face of the metal foil having an inverse tapered shape.

Additionally, it is possible to prevent removal of the insulating layer or displacement of the insulating layer.

Moreover, in the case where the protuberances protrude from the edge face of the metal foil, the protuberances fit into the insulating layer, and an anchor effect is produced.

Consequently, it is possible to more reliably prevent the insulating layer from being removed from the metal foil or prevent displacement of the position of the insulating layer from the position of the metal foil, and it is possible to ensure excellent alignment of the electrode of the solar cell with respect to the electrode of the metal foil.

A metal foil layered body of a seventh aspect of the invention includes: a base member; an adhesive layer provided on one face of the base member; a metal foil having an electroconductive pattern placed on the base member with the adhesive layer interposed therebetween; and a protuberance provided around a region on which an electroconductive member of the metal foil is to be provided.

In the metal foil layered body of the seventh aspect of the invention, since the protuberance is provided on a metal foil having a wiring pattern and around the area on which an electroconductive member is to be mounted, the electroconductive member is blocked and held by the protuberance even where heated-molten electroconductive members have flowability in a connecting step.

For this reason, the electroconductive members does not flow out and is not short-circuited to the adjacent wiring patterns of the metal foil or to the other wiring or the like, it is possible to reliably connect the electroconductive member provided on the metal foil to electrodes or wirings of the members different from the electroconductive members.

In the metal foil layered body of the seventh aspect of the invention, it is preferable that a flowable electroconductive member be mounted on the region on which the electroconductive member of the metal foil is to be provided, the electroconductive member be blocked by the protuberance.

In the metal foil layered body of the seventh aspect of the invention, the electroconductive member is mounted on the region on which the electroconductive member of the metal foil is to be provided, and the electroconductive member is blocked by the protuberances.

Accordingly, in the case where a metal foil having a wiring pattern is electrically connected to the other electrodes or wirings, it is possible to prevent a flowable electroconductive member from being connected and short-circuited to an adjacent wiring pattern or the like due to leaking from the metal foil.

In the metal foil layered body of the seventh aspect of the invention, it is preferable that a cross-sectional shape of the protuberance be substantially triangular, and that the protuberance protrude from a side face of the metal foil.

Because of this, even where the electroconductive member is held by the region on which an electroconductive member of the metal foil is to be mounted, since the protuberance is provided which rises at the periphery of the region on which an electroconductive member is to be mounted, the electroconductive member accumulates due to the protuberance, and it is possible to prevent the electroconductive member from leaking from the protuberance toward the outer side.

In the metal foil layered body of the seventh aspect of the invention, it is preferable that the protuberance be formed of a burr which is generated when a metal foil is cut.

When the metal foil layered body is manufactured, the metal foil sheet is cut with a cutting blade, the cut edge face protrudes from the metal foil, burrs are thereby formed, and it is possible to utilize the burrs as protuberances.

In the metal foil layered body of the seventh aspect of the invention, it is preferable that the electroconductive member be solder or silver paste.

Therefore, since the electroconductive members obtain flowability by heating, it is possible to easily connect the metal foil to the other wirings or electrodes with the electroconductive member.

A solar cell module of an eighth aspect of the invention includes: the metal foil layered body of the seventh aspect; a solar cell having an electrode provided on a back face thereof, the electrode being electrically connected to a wiring pattern made of the metal foil with the electroconductive member interposed therebetween; a seal member sealing the solar cell; and a light-transmissive front plate stacked in layers on a face on the opposite side of the face of the seal member on which the metal foil is provided.

According to the solar cell module of the eighth aspect of the invention, the protuberance is provided around the region of a metal foil having a wiring pattern, on which an electroconductive member is to be provided. Therefore, even where the electroconductive member has flowability when the solar cell is connected to the metal foil, the electroconductive member is blocked by the protuberance and maintained on the metal foil.

Consequently, the electrode of the solar cell can be reliably connected to the metal foil with the electroconductive member interposed therebetween, and it is possible to prevent the adjacent wiring patterns of the other metal foil or the like from being short-circuited which is due to leak of a molten electroconductive member from the protuberance.

A metal foil multi-layer substrate of a ninth aspect of the invention includes: a stage base member; a self-adhesive film provided on the stage base member; and a metal foil sheet patterned and provided on the self-adhesive film.

Effects of the Invention

According to the invention, since removal of the metal foil pattern is prevented as a result of an anchor effect of the burrs with respect to the adhesive layer, durability can be improved.

According to the invention, durability can be improved as a result of an anchor effect of the burrs with respect to the adhesive layer.

Moreover, it is possible to avoid the top surface of the base member from being damaged due to the buffer layer, and a high level of product reliability can be maintained.

The invention includes the insulating layer that coats the metal foil which is stacked in layers on the base member with the adhesive layer interposed therebetween, the edge face of the severed metal foil is inclined so as to have an inverse tapered shape, and the insulating layer is attached firmly to and fitted onto the edge face.

For this reason, it is possible to prevent the insulating layer from being removed from the metal foil and from being displaced, and it is possible to ensure the configuration of an integrally-formed metal foil pattern layered body.

According to the invention, the edge face of the metal foil is inclined so as to have an inverse tapered shape, and the protuberance protrudes from the edge face to the insulating layer.

Because of this, the insulating layer is attached firmly to and fitted onto the edge face of the metal foil having an inverse tapered shape, the protuberance projects to the insulating layer, an anchor effect is produced, it is possible to reliably prevent the insulating layer from being removed from the metal foil and from being displaced, and it is possible to ensure the configuration of an integrally-formed metal foil pattern layered body.

According to the invention, the insulating layer sealing the solar cells coats the edge face of the metal foil having an inverse tapered shape so as to be attached firmly thereto.

Furthermore, in the case of providing the protuberances the protuberances project to the insulating layer, and the anchor effect is produced.

Therefore, it is possible to reliably prevent the insulating layer from being removed from the metal foil and from being displaced.

Consequently, it is possible to ensure excellent alignment of the electrode of the solar cell with respect to the electrode of the metal foil.

According to the invention, since the protuberance is provided around the region of the metal foil having a wiring pattern, on which an electroconductive member is to be provided, the electroconductive member is blocked and held by the protuberance even where the electroconductive member has flowability when the metal foil is connected to the other wirings pattern.

Accordingly, it is possible to connect the wiring pattern to electrodes or wirings of members different form the electroconductive member without short-circuiting to adjacent other wirings pattern or the like.

Furthermore, according to the invention, since the protuberance is provided around the region of the metal foil having a wiring pattern, on which an electroconductive member is to be provided, the electroconductive member is blocked and held by the protuberance even where the electroconductive member has flowability when the solar cell is connected to the metal foil.

As a result, it is possible to reliably connect the wiring pattern to the electrode of the solar cell without short-circuiting of wirings adjacent to each other.

DETAILED DESCRIPTION OF THE INVENTION

First Embodiment

Firstly, a solar cell module 100 including a metal foil pattern layered body 10 of a first embodiment of the invention will be particularly described with reference to FIGS. 1 to 6.

Figure 1:
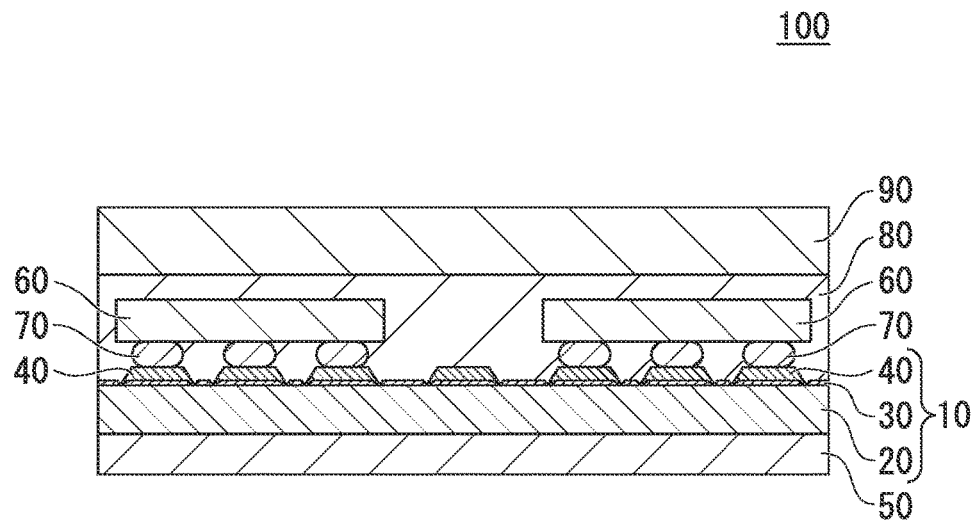
FIG. 1 is a vertical cross-sectional view showing a solar cell module of a first embodiment of the invention.

FIG. 1 is a vertical cross-sectional view showing the solar cell module 100 of the first embodiment.

The solar cell module 100 is provided with: a metal foil pattern layered body 10; a back sheet 50 that is provided at the back face side of the metal foil pattern layered body 10 (lower side of the metal foil pattern layered body 10 in FIG. 1, and the position close to the back face of the metal foil pattern layered body 10); a plurality of solar cells 60 that are provided at the top face side of the metal foil pattern layered body 10 (upper side of the metal foil pattern layered body 10 in FIG. 1, and the position close to the top face of the metal foil pattern layered body 10); a seal member 80 that seals the solar cells 60 on the metal foil pattern layered body 10; and a light-transmissive substrate 90 that is provided at the top face side of the seal member 80 (upper side of the seal member 80 FIG. 1, the position close to the top face of the seal member 80).

In addition, in the first embodiment, electrical connectors 70 used to connect the metal foil pattern layered body 10 to the solar cells 60 are used.

The metal foil pattern layered body 10 is a member used for connection of a back-contact type solar cells 60 in the first embodiment and is constituted of a base member 20, an adhesive layer 30, and a metal foil pattern 40 (metal foil).

As the base member 20, for example, a base member formed of an insulation material such as imide resins or the like, which is formed in a sheet shape, is used, and polyimide is adopted as the imide resins in the first embodiment.

Polyimide have the highest level of heat resistance, mechanical characteristics, and chemical stability in high-polymers.

As the adhesive layer 30, for example, an adhesive made of epoxy resins is used.

The epoxy-based adhesive has excellent heat resistance as compared with urethane resins or polyester-based adhesive.

The adhesive layer 30 is layered over an entire area of the base member 20.

The metal foil pattern 40 is a layer that is electrically connected to the solar cells 60 and is stacked in layers on the top face of the base member 20 with the adhesive layer 30 interposed therebetween.

The metal foil pattern 40 have a pattern that electrically connects the solar cells 60 in series, which are stacked in layers on the metal foil pattern layered body 10; part of the top surface 41 of the metal foil pattern 40 functions as an electrode that is electrically connected to the solar cell 60.

The metal foil pattern 40 is a predetermined pattern provided on the metal foil and is constituted of an opening and a metal portion.

The opening is a portion at which the metal foil is partially removed.

The metal portion is a portion at which the metal foil pattern 40 remains after the opening is formed by partially removing the metal foil.

Figure 2:
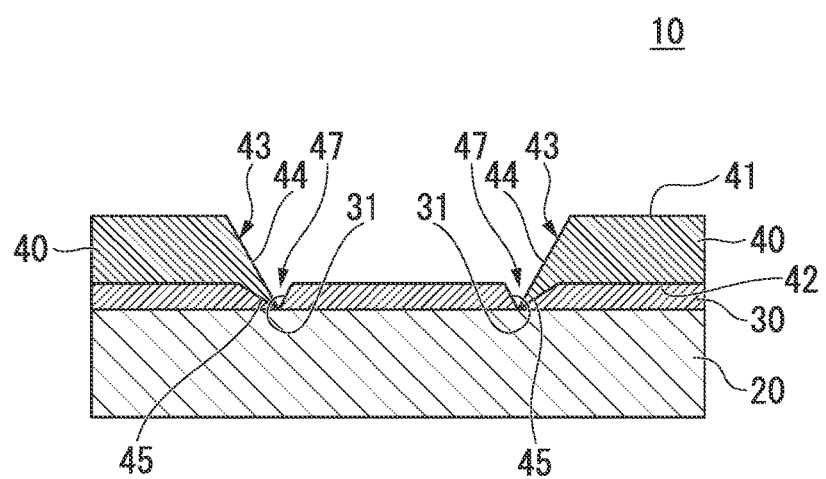
FIG. 2 is an enlarged view partially showing a metal foil pattern layered body of the first embodiment of the invention shown in FIG. 1.

In FIG. 2, the portion to which the adhesive layer 30 is exposed is the opening, and the metal foil which is provided (remains) on the adhesive layer 30 is the metal portion.

As a material used to form the metal foil pattern 40, for example, copper, aluminum, and various aluminum alloys or the like is used.

Additionally, in the other cases, any materials may be used as a material used to form the metal foil pattern 40 as long as they are used to form a printed-wiring board such as nickel, gold, silver, zinc, brass, and a laminated metal made thereof, or the like.

As shown in FIG. 2 in details, burrs 43 (protuberances) that are bended toward the back face 42 from the top face 41 of the metal foil pattern 40 is formed at the side portion of the metal foil pattern 40, that is, at the edge of the metal foil pattern 40 in the direction orthogonal to a stacked direction (vertical direction in FIGS. 1 and 2) of the metal foil pattern 40.

The burrs 43 are provided at the metal foil at a boundary between the opening and the metal portion.

By means of this structure, the burrs 43 are formed inside the adhesive layer 30 so as to protrude from the side portion of the metal foil pattern 40 to the back face 42.

In other words, the burrs 43 are formed to cover the surface formed at the edge of the adhesive layer 30.

Such burr 43 is provided with a first inclined surface (inclined surface) 44 and a second inclined surface (inclined surface) 45.

The first inclined surface 44 retreats so as to extend toward the back face side (toward the base member 20) with continuously directed in the direction from the top face 41 of the metal foil pattern 40 to the lateral portion of the metal foil pattern 40 (the front-end portion of the burr 43).

The second inclined surface 45 retreats so as to extend toward the base member 20 with continuously directed in the direction from the back face 42 of the metal foil pattern 40 to the lateral portion of the metal foil pattern 40 (the front-end portion of the burr 43).

The entire second inclined surface 45 is formed inside the adhesive layer 30 and attached firmly to the adhesive layer 30.

The first inclined surface 44 and the second inclined surface 45 are connected to and intersect each other at the edge of the burr 43 formed at the position which is closest to the base member 20.

Particularly, in the first embodiment, the front-end portion of the burr 43 which forms crossed ridge lines of the first inclined surface 44 and the second inclined surface 45 reaches the boundary between the adhesive layer 30 and the base member 20.

Moreover, even where the front-end portion of the burr 43 does not reach the boundary between the adhesive layer 30 and the base member 20, it is only necessary for the front-end portion to be formed inside the adhesive layer 30.

Furthermore, a cut portion 47 is formed inside the adhesive layer 30 along the first inclined surface 44 of the burr 43 with providing the burrs 43 in the above-described manner.

The cut portion 47 opens at the top face 41 of the metal foil pattern 40.

The cut portion 47 is defined by the first inclined surface 44 of the burr 43 and an adhesive-layer inclined surface 31 facing the first inclined surface 44 in a direction orthogonal to the stacked direction.

Particularly, the first inclined surface 44 of the burr 43 and the adhesive-layer inclined surface 31 intersect each other at the bottom of the cut portion 47 (the position which is closest to the base member 20).

Accordingly, the shape of the cut portion 47 is a substantially triangle in the vertical cross-sectional face thereof.

The back sheet 50 has a function to, for example, adjust air permeability.

A material having long-term reliability such as weatherability, insulation property, or the like is used to form the back sheet 50, and for example, a fluoroplastic film, a low-oligomer heat-resistant polyethylene terephthalate (PET) film/a polyethylene naphthalate (PEN) film, a silica ($SiO_2$) deposited film, an aluminum foil, or the like is employed.

In the first embodiment, as the back sheet 50, a resin layer containing polyvinyl fluoride as a main agent is formed.

The solar cells 60 are provided at the top face side of the metal foil pattern layered body 10 at a distance in a direction orthogonal to the stacked direction.

As the solar cell 60, for example, a single-crystal silicon solar cell, a polysilicon solar cell, an amorphous silicon solar cell, a compound solar cell, a dye-sensitized solar cell, or the like is used.

Among those, in terms of a high level of power generation efficiency, single-crystal silicon is preferable.

Electrodes which are a positive electrode and a negative electrode are provided on the back face side of the solar cells 60.

The electrical connectors 70 are members that subserve electrical connection between the metal foil pattern 40 and the solar cells 60.

As a material used for electrical-conductive connection, a material having a low level of electrical resistance is used.

Among them, in terms of a low electrical resistance with respect to the metal foil pattern 40, a material containing one or more metals selected from the group consisting of silver, copper, tin, lead, nickel, gold, and bismuth is preferable.

Furthermore, since the electrical connectors 70 has a high viscosity and can be easily deformed into a desired shape, it is preferable to contain one or more metals selected from the group consisting of silver, copper, tin, solder (containing copper and lead as a main component).

The seal member 80 is formed of a seal film.

As the seal film, for example, an EVA sheet, ethylene (meth) acrylic acid ester copolymer film, a fluoroplastic film such as polyvinylidene-fluoride or the like is generally used.

As the seal member 80, an EVA sheet is adopted in the first embodiment.

Generally, two or more seal films are used so as to sandwich the solar cells 60.

The seal member 80 which serves as an insulating layer is stacked in layers on a surface on a side opposite to the adhesive layer 30 of the metal foil pattern 40.

In other cases, a different insulating member may be provided between the metal foil pattern 40 and the seal member 80.

As the above-described insulating member, for example, solder resist is adopted.

As the light-transmissive substrate 90, for example, a glass substrate, a transparent resin substrate, or the like is adopted.

As a transparent resin forming transparent resin substrate, for example, acrylic resin, polycarbonate, polyethylene terephthalate, or the like is adopted.

Next, a method of manufacturing the solar cell module 100 of the first embodiment will be described.

Firstly, the metal foil pattern layered body 10 is manufactured.

Figure 3:
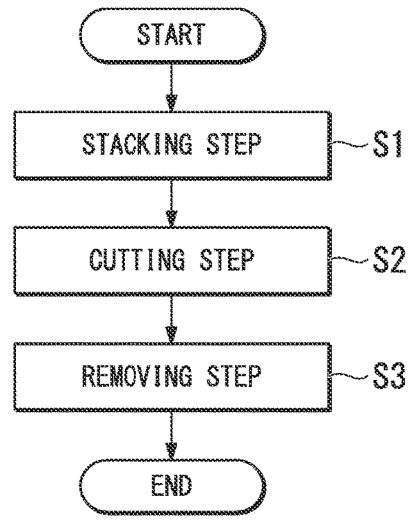
FIG. 3 is a flowchart illustrating a method of manufacturing a metal foil pattern layered body of the first embodiment of the invention.

As shown in FIG. 3, the metal foil pattern layered body 10 is subjected to three steps of a stacking step S1, a cutting step S2, and a removing step S3 in this order, and is thereby manufactured.

Figure 4:
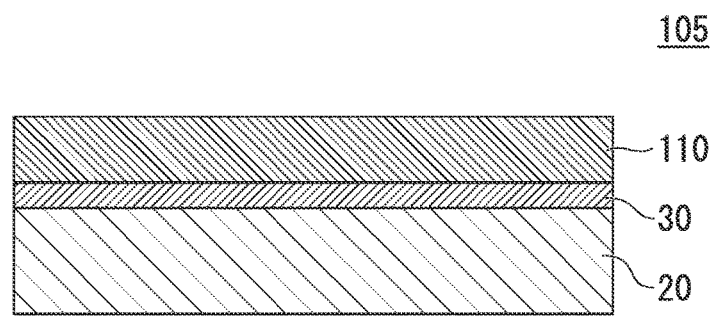
FIG. 4 is a view illustrating a stacking step of the first embodiment of the invention.

In the stacking step S1, as shown in FIG. 4, a layered structure 105 is manufactured as a result of staking the adhesive layer 30 and metal foil 110 in layers on the base member 20 in this order.

That is, as a result of stacking the metal foil 110 on the top face of the adhesive layer 30 in a state where the adhesive layer 30 is applied over the entire area of the top face of the base member 20, the layered structure 105 configured to include such three layers is manufactured.

The metal foil 110 is formed of the same material as that of the above-mentioned metal foil pattern 40.

In particular, in the stacking step S1, for example, a base member roll around which the base member 20 wound in a roll state and a metal foil roll around which the metal foil 110 is wound similarly in a roll state are prepared.

It is preferable that, while sequentially transferring the base member 20 and the metal foil 110 from the rolls, an adhesive that is used as the adhesive layer 30 be applied on the top face of the transferred base member 20, the metal foil 110 be attached to the adhesive layer 30, and the layered structure 105 be thereby manufactured.

Figure 5:
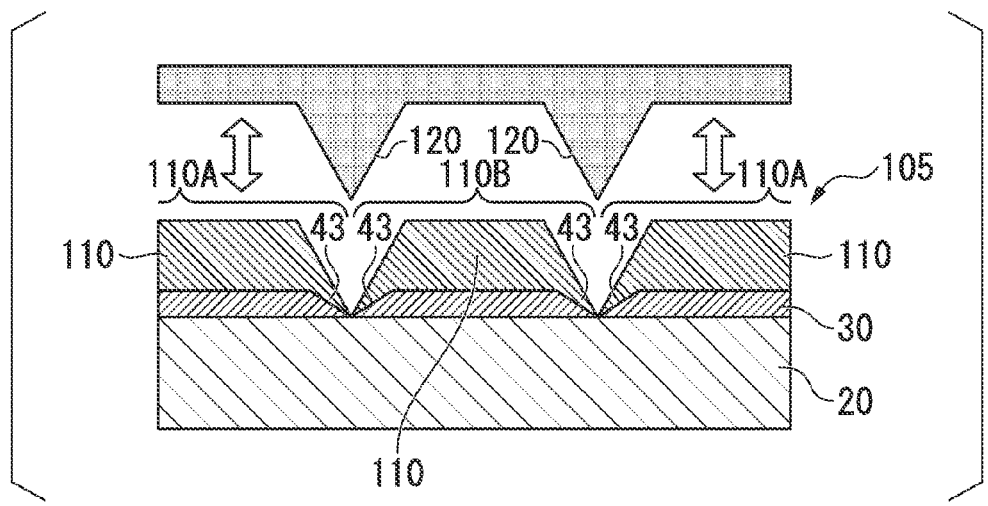
FIG. 5 is a view illustrating a cutting step of the first embodiment of the invention.

In the cutting step S2, as shown in FIG. 5, a die provided with a plurality of blades 120 is disposed so as to face the metal foil 110, and the ends of the blades 120 are pressed onto the top face of the metal foil 110.

Because of this, the front edge of the blade 120 reaches at least the inside of the adhesive layer 30 while cutting the metal foil 110.

In the first embodiment, the front edge of the blade 120 reaches the boundary between the adhesive layer 30 and the base member 20.

Accordingly, as shown in FIG. 5, the metal foil 110 is separated into a necessary region 110A which has to remain as the metal foil pattern 40 and an unnecessary region 110B which is to be removed from the base member 20 and the adhesive layer 30.

In the first embodiment, the region between the pair of blades 120 on the metal foil 110 is the unnecessary region 110B, and the portion outside the unnecessary region 110B is the necessary region 110A.

Particularly, in the cutting step S2, it is preferable that a pinnacle blade be used as the blade 120.

Consequently, the metal foil 110 can continuously be cut.

Moreover, according to the cutting step S2 in this manner, the side portion of the metal foil 110 that is separated into the necessary region 110A and the unnecessary region 110B, that is, the edge of the metal foil 110 in a direction orthogonal to the stacked direction is bended toward the base member 20 by pressing the blade 120, becoming the burr 43.

Particularly, in the first embodiment, since the front edge of the blade 120 reaches at least the inside of the adhesive layer 30, the burr 43 is also bended so as to project to the inside of the adhesive layer 30.

Next, the removing step S3 is carried out.

In the removing step S3, the layered structure 105 is wound around a roll so that, for example, the top face (the metal foil side 110) of the layered structure 105 that was subjected to the cutting step S2 is located at an outer circumferential side, and thereby this step is carried out.

Figure 6:
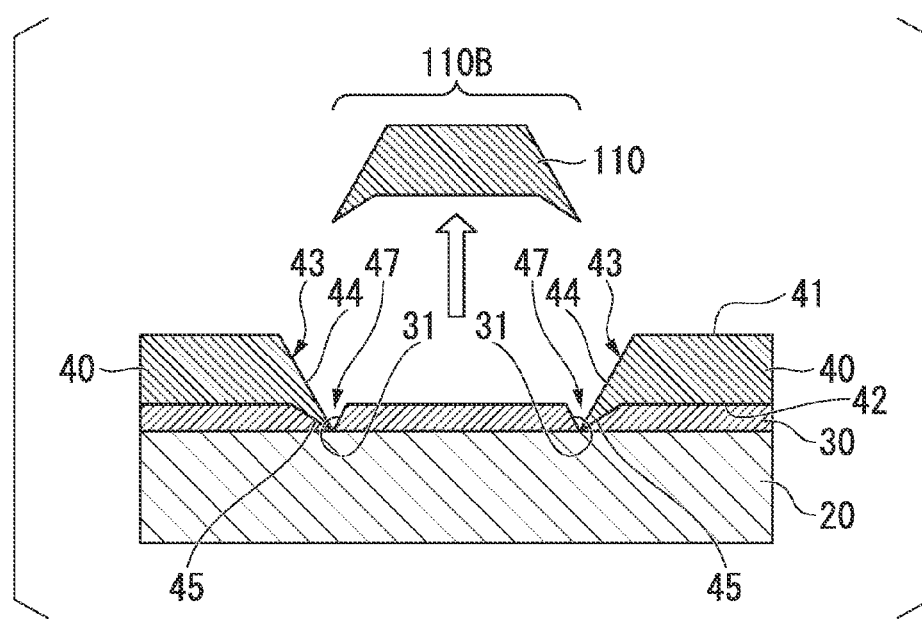
FIG. 6 is a view illustrating a removing step of the first embodiment of the invention.

In this way, as shown in FIG. 6, the unnecessary region 110B of the metal foil 110 is only removed from the adhesive layer 30, and the necessary region 110A of the metal foil 110 only remains as the metal foil pattern 40 on the adhesive layer 30.

Moreover, in order to only remove the unnecessary region 110B of the metal foil 110 in the above-described manner, for example, it is only necessary to make the contact area of the unnecessary region 110B of the metal foil 110 with respect to the adhesive layer 30 smaller than the contact area of the necessary region 110A with respect to the adhesive layer 30, and to suitably adjust the curvature thereof during the roll-shape winding.

Due to the above-described three steps, as shown in FIG. 2, it is possible to obtain the metal foil pattern layered body 10 provided with the metal foil pattern 40 having the burrs 43.

Subsequently, as shown in FIG. 1, the solar cell module 100 is manufactured by use of the metal foil pattern layered body 10.

Firstly, the electrical connectors 70 are formed on the top face 41 of the metal foil pattern 40 of the metal foil pattern layered body 10, and the solar cells 60 are arranged on the metal foil pattern layered body 10 so that electrodes of the solar cells 60 face the electrical connectors 70.

Next, such the metal foil pattern layered body 10, the electrical connectors 70, and the solar cells 60 are externally heated and pressed.

Consequently, the solar cells 60 are mounted onto the metal foil pattern 40 of the metal foil pattern layered body 10.

Next, the solar cells 60 are sealed by the seal member 80 so as to cover the periphery of the solar cells 60.

Because of this, the metal foil 110 and the adhesive layer 30 in the metal foil pattern layered body 10 is in a state being in close contact with the seal member 80.

At this time, the inside of the cut portion 47 formed in the adhesive layer 30 is also filled with the seal member 80.

Thereafter, the back sheet 50 is stacked in layers on the back face side of the base member 20 of the metal foil pattern layered body 10 (the surface opposite to the surface of the base member 20 on which the metal foil pattern 40 is formed).

Additionally, the light-transmissive substrate 90 formed integrally with the surface of the seal member 80.

For this reason, as shown in FIG. 1, it is possible to obtain the solar cell module 100 in which the solar cells 60 are electrically connected in series to each other by use of the metal foil pattern 40.

According to the metal foil pattern layered body 10 of the solar cell module 100 in the above-description, since the burrs 43 are formed to project to the inside the adhesive layer 30, and an anchor effect that is due to the burrs 43 and the adhesive layer 30 is produced.

That is, since the entire area of the second inclined surfaces 45 of the burrs 43 is attached firmly to the adhesive layer 30, it is possible to increase the contact area between the metal foil pattern 40 and the adhesive layer 30 as compared with the case of not providing the burrs 43.

Accordingly, it is possible to tightly fix the metal foil pattern 40 to the adhesive layer 30.

As a result, since it is possible to prevent the metal foil pattern 40 from being removed, the metal foil pattern 40 and durability of the solar cell module 100 using the metal foil pattern 40 can be improved.

Furthermore, in the first embodiment, since the burrs 43 of the metal foil pattern 40 have the first inclined surface 44 that retreats toward the back face side in the direction toward the edge side of the metal foil pattern 40, light with which the top face of the first inclined surface 44 is irradiated can be reflected by the first inclined surface 44.

For this reason, it is possible to allow the light, which passes through the interval between the solar cells 60 adjacent to each other and reaches the first inclined surface 44, to be reflected and to be incident to the solar cells 60.

As a consequence, it is possible to improve light utilization efficiency of the solar cell module 100.

Furthermore, in the solar cell module 100, since an anchor effect that is due to the first inclined surface 44 and the seal member 80 is produced, it is possible to further improve the adhesive strength between the metal foil pattern 40 and the seal member 80.

In addition, in the first embodiment, the cut portion 47 is formed inside the adhesive layer 30 along the first inclined surface 44.

Consequently, in the case where a coated layer formed of the material (other material) which is different from the metal foil pattern layered body is stacked on the top face of the metal foil pattern layered body 10, that is, in the case where the seal member 80 is stacked in layers on the top face of the metal foil pattern layered body 10 when the solar cell module 100 is configured, an anchor effect that is due to the seal member 80 and the cut portion 47 formed in the adhesive layer 30 is produced.

For this reason, it is possible to tightly fix the seal member 80 to the adhesive layer 30, and it is possible to further improve the strength of the solar cell module 100.

According to the method of manufacturing the metal foil pattern layered body 10 of the solar cell module 100, the front edge of the blade 120 reaches at least the adhesive layer 30.

Therefore, the edge of the metal foil 110 becoming the cutting portion that is cut by the blade 120 becomes the burr 43, and the burr 43 projects to the base member 20, that is, to the inside of the adhesive layer 30.

By means of this structure, as a result of the anchor effect that is due to the burrs 43 and the adhesive layer 30, it is possible to firmly fix the metal foil pattern 40 to the adhesive layer 30.

Second Embodiment

Next, a metal foil pattern layered body 15 of a second embodiment of the invention will be explained with reference to FIG. 7.

Figure 7:
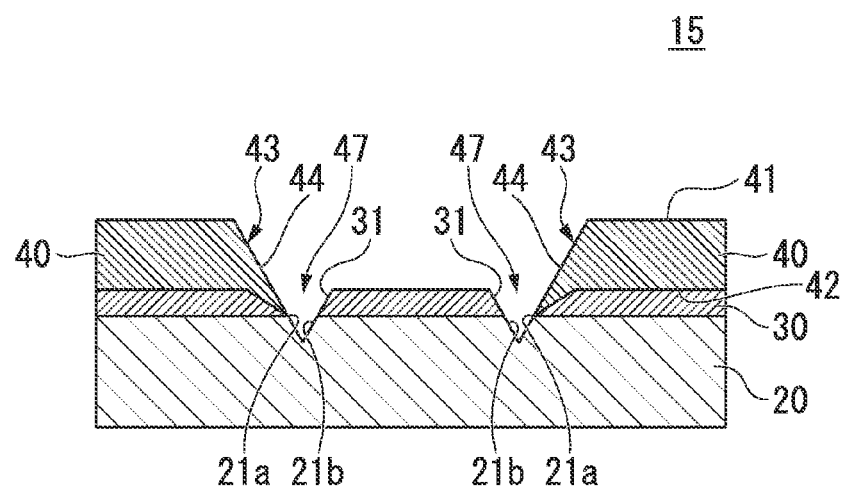
FIG. 7 is an enlarged view partially showing a metal foil pattern layered body of a second embodiment of the invention.

In FIG. 7, identical symbols are used for the elements which are identical to those of FIG. 2, and detailed explanations thereof are omitted here.

The configuration of the cut portion 47 of the metal foil pattern layered body 15 of the second embodiment is different from that of the first embodiment.

The cut portion 47 of the second embodiment is continuously formed inside the adhesive layer 30 and inside the base member 20.

That is, the cut portion 47 is defined by a first base member inclined surface 21*a*, the adhesive-layer inclined surface 31, and a second base member inclined surface 21*b*.

Here, the first base member inclined surface 21*a* forms a continuous surface with the first inclined surface 44 and is formed inside the base member 20 so as to extend along the first inclined surface 44.

The second base member inclined surface 21*b* is an inclined surface facing the first base member inclined surface 21*a* in a direction orthogonal to the stacked direction.

The first inclined surface 44 and the first base member inclined surface 21*a* are on the same plane, and the adhesive-layer inclined surface 31 and the second base member inclined surface 21*b* are on the same plane.

In particular, at the bottom of the cut portion 47 formed inside the base member 20, a pair of base member inclined surfaces 21*a* and 21*b* intersect each other.

Accordingly, the shape of the cut portion 47 is a substantially triangle in the vertical cross-sectional face thereof.

Such cut portions 47 are formed as a result of pressing the blade 120 onto the layered structure 15 so that the front edge of the blade 120 reaches the inside of the base member 20 in the cutting step S2 of the manufacture of the metal foil pattern layered body 15.

Consequently, in the case where a coated layer formed of the material (other material) which is different from the metal foil pattern layered body, that is, the seal member 80 is stacked on the top face of the metal foil pattern layered body 15, an anchor effect that is due to the seal member 80 and the base member 20 is produced in addition to that an anchor effect that is due to the seal member 80 and the adhesive layer 30.

For this reason, it is possible to firmly fix the seal member 80 to the metal foil pattern layered body 15, and it is possible to further improve the strength of the solar cell module 100.

The first embodiment and the second embodiment of the invention are described above, the technical scope of the invention is not limited to the above embodiments, and various modifications may be made without departing from the scope of the invention.

In the first embodiment and the second embodiment, the metal foil pattern layered bodies 10 and 15 are used to connect back contact solar cells 60 to each other as an example; however, it is not limited to such connection structures of the solar cells, and the metal foil pattern layered bodies may be used to electrically connect other packaged devices or electronic parts, or the like.

Third Embodiment

Next, a solar cell module 100 provided with a metal foil pattern layered body 210 of a third embodiment of the invention will be particularly described with reference to FIGS. 8 to 12.

In the third embodiment, identical symbols are used for the elements which are identical to those of the first embodiment and the second embodiment, and the explanations thereof are omitted or simplified here.

Figure 8:
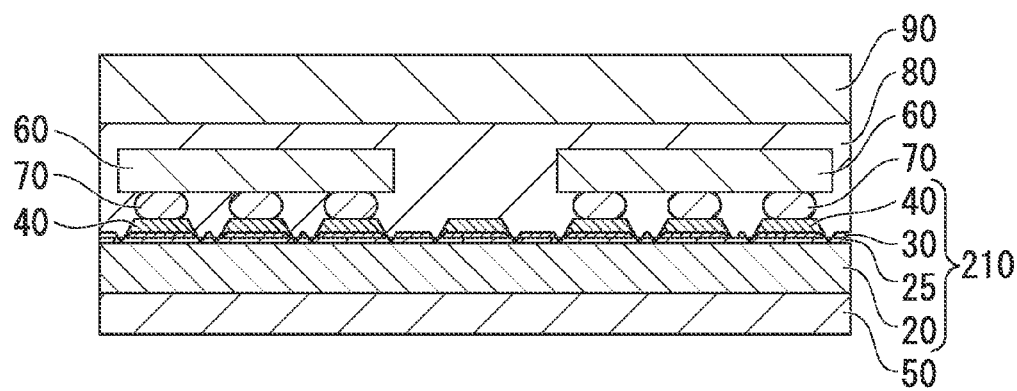
FIG. 8 is a vertical cross-sectional view showing a solar cell module of a third embodiment of the invention.

FIG. 8 is a vertical cross-sectional view showing the solar cell module 200 of the third embodiment.

The solar cell module 200 is provided with: a metal foil pattern layered body 210; a back sheet 50 that is provided at the back face side of the metal foil pattern layered body 210 (lower side of the metal foil pattern layered body 210 in FIG. 8, and the position close to the back face of the metal foil pattern layered body 210); a plurality of solar cells 60 that are provided at the top face side of the metal foil pattern layered body 210 (upper side of the metal foil pattern layered body 210 in FIG. 8, and the position close to the top face of the metal foil pattern layered body 210); a seal member 80 that seals the solar cells 60 on the metal foil pattern layered body 210; and a light-transmissive substrate 90 that is provided at the top face side of the seal member 80.

In addition, in the third embodiment, electrical connectors 70 used to connect the metal foil pattern layered body 210 to the solar cells 60 are used.

The metal foil pattern layered body 210 is a member used for connection of a back-contact type solar cells 60 in the third embodiment and is constituted of a base member 20, a buffer layer 25, an adhesive layer 30, and a metal foil pattern 40.

This means that, the buffer layer 25 is disposed between the base member 20 and the adhesive layer 30.

The buffer layer 25 is stacked in layers on the top face of the base member 20, and polymer resins which are relatively inexpensive or adhesives such as a PET film or the like may be used as a material used to form the buffer layer 25.

Particularly, the thickness of the buffer layer 25 is substantially equal to or greater than that of, for example, the adhesive layer 30.

As a material used to form the adhesive layer 30, the same material as that in the aforementioned embodiment is used.

Moreover, the thickness of the adhesive layer 30 is, for example, approximately 10 μm.

The metal foil pattern 40 is a layer that is electrically connected to the solar cells 60 and is stacked in layers on the top face of the base member 20 with the adhesive layer 30 interposed therebetween.

The metal foil pattern 40 have a pattern that electrically connects the solar cells 60 in series, which are stacked in layers on the metal foil pattern layered body 210; part of the top surface 41 of the metal foil pattern 40 functions as an electrode that is electrically connected to the solar cell 60.

Figure 9:
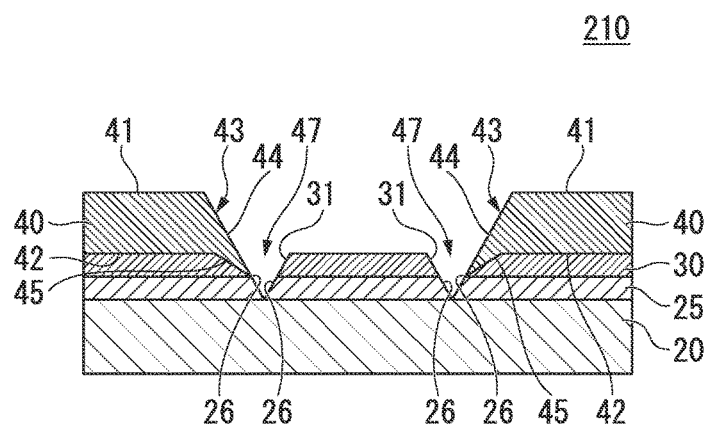
FIG. 9 is an enlarged view partially showing a metal foil pattern layered body of the third embodiment of the invention shown in FIG. 8.

As shown in FIG. 9 in details, burrs 43 that are bended toward the back face 42 from the top face 41 of the metal foil pattern 40 is formed at the side portion of the metal foil pattern 40, that is, at the edge of the metal foil pattern 40 in the direction orthogonal to a stacked direction (vertical direction in FIGS. 8 and 9) of the metal foil pattern 40.

By means of this structure, the burrs 43 are formed inside the adhesive layer 30 so as to protrude from the side portion of the metal foil pattern 40 to the back face 42.

Similar to the aforementioned embodiments, such burr 43 is provided with a first inclined surface (inclined surface) 44 and a second inclined surface (inclined surface) 45.

However, in terms of formation of the buffer layer 25 between the adhesive layer 30 and the base member 20, the third embodiment is different from the above-described embodiments.

The first inclined surface 44 and the second inclined surface 45 are connected to and intersect each other at the edge of the burr 43 formed at the position which is closest to the base member 20.

Particularly, in the third embodiment, the front-end portion of the burr 43 which forms crossed ridge lines of the first inclined surface 44 and the second inclined surface 45 reaches the boundary between the adhesive layer 30 and the buffer layer 25.

Moreover, even where the front-end portion of the burr 43 does not reach the boundary between the adhesive layer 30 and the buffer layer 25, it is only necessary for the front-end portion to be formed inside the adhesive layer 30.

Additionally, the front-end portion of the burr 43 may be formed in both insides of the adhesive layer 30 and the buffer layer 25.

Furthermore, since the burrs 43 are provided in the above-described manner, accordingly, a cut portion 47 is formed inside the adhesive layer 30 and the buffer layer 25 along the first inclined surface 44 of the burr 43.

The cut portion 47 opens at the top face 41 of the metal foil pattern 40.

The cut portion 47 is defined by a first buffer layer inclined surface 26, the adhesive-layer inclined surface 31, and the second base member inclined surface 21b.

Here, the first buffer layer inclined surface 26 forms a continuous surface with the first inclined surface 44 and is formed inside the buffer layer 25 so as to extend along the first inclined surface 44 toward the buffer layer 25.

The adhesive-layer inclined surface 31 faces the first inclined surface 44 in a direction orthogonal to the stacked direction.

The second-buffer-layer inclined surface 26 faces the first buffer layer inclined surface 26 in a direction orthogonal to the stacked direction.

The first inclined surface 44 and the first buffer layer inclined surface 26 are on the same plane, and the adhesive-layer inclined surface 31 and the second-buffer-layer inclined surface 26 are on the same plane.

In particular, at the bottom of the cut portion 47 formed inside the buffer layer 25, a pair of buffer layer inclined surfaces 26 intersect each other.

Accordingly, the shape of the cut portion 47 is a substantially triangle in the vertical cross-sectional face thereof.

Next, a method of manufacturing the solar cell module 200 of the third embodiment will be described.

Firstly, the metal foil pattern layered body 210 is manufactured.

As described in the above-mentioned first embodiment with reference to FIG. 3, the metal foil pattern layered body 210 is subjected to three steps of a stacking step S1, a cutting step S2, and a removing step S3 in this order, and is thereby manufactured.

Figure 10:
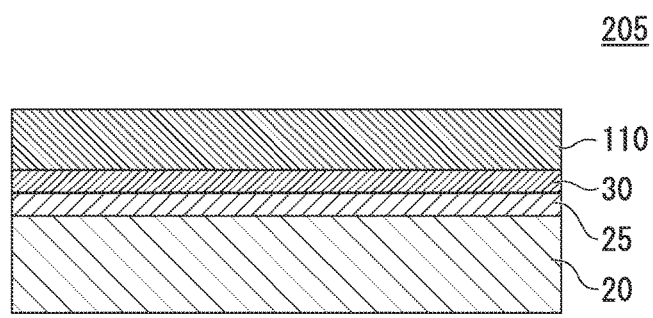
FIG. 10 is a view illustrating a stacking step of the third embodiment of the invention.

In the stacking step S1, as shown in FIG. 10, a layered structure 205 is manufacture in which the buffer layer 25, the adhesive layer 30, and the metal foil 110 are sequentially stacked in layers on the base member 20.

That is, after the buffer layer 25 is stacked on and fixed to the top face of the base member 20, the metal foil 110 is stacked on the top face of the adhesive layer 30 in a state where the adhesive layer 30 is applied on the top face of the buffer layer 25, and the layered structure 205 that is constituted of such four layers is thereby manufactured.

The metal foil 110 is formed of the same material as that of the above-mentioned metal foil pattern 40.

Moreover, when the layered structure 205 is manufactured in the stacking step S1, for example, a base member roll around which the base member 20 wound in a roll state and a buffer layer roll around which the buffer layer 25 is similarly wound in a roll state are prepared.

The base member 20 and the buffer layer 25 are stacked on each other while being sequentially transferred from the rolls.

Thereafter, it is preferable that, an adhesive that is used as the adhesive layer 30 be applied on the top face of the buffer layer 25, the metal foil 110 be attached to the adhesive layer 30, and the layered structure 205 be thereby manufactured.

Furthermore, as described in the aforementioned embodiment, a metal foil roll around which the metal foil 110 are wound in a roll state is prepared, the metal foil 110 may be attached to the adhesive layer 30 while transferring the metal foil 110 from the metal foil roll.

Figure 11:
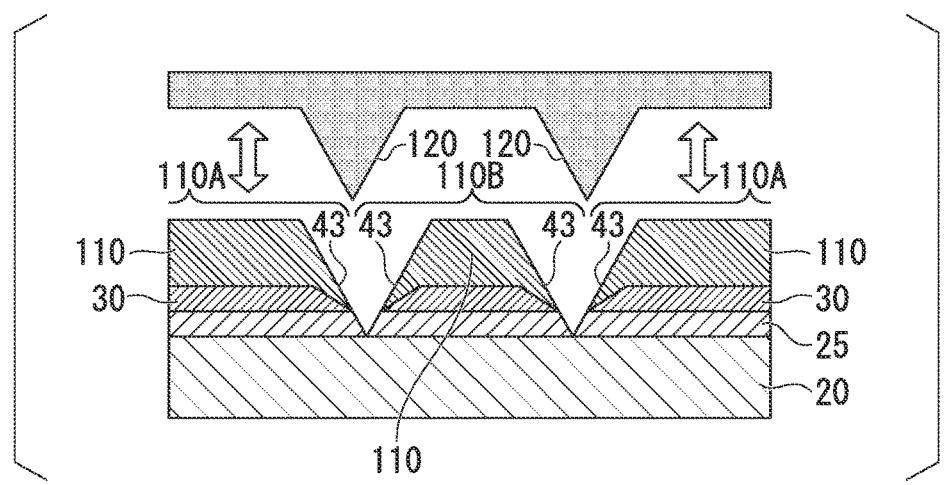
FIG. 11 is a view illustrating a cutting step of the third embodiment of the invention.

In the cutting step S2, as shown in FIG. 11, a die provided with a plurality of blades 120 is disposed so as to face the metal foil 110, and the ends of the blades 120 are pressed onto the top face of the metal foil 110.

Because of this, the front edge of the blade 120 penetrates through the adhesive layer, the front edge of the blade 120 reaches the boundary between the buffer layer 25 and the base member 20 while cutting the metal foil 110.

Accordingly, as shown in FIG. 11, the metal foil 110 is separated into a necessary region 110A which has to remain as the metal foil pattern 40 and an unnecessary region 110B which is to be removed from the base member 20 and the adhesive layer 30.

In the third embodiment, the region between the pair of blades 120 on the metal foil 110 is the unnecessary region 110B, and the portion outside the unnecessary region 110B is the necessary region 110A.

Particularly, in the cutting step S2, it is preferable that a pinnacle blade be used as the blade 120.

Consequently, the metal foil 110 can continuously be cut.

Moreover, according to the cutting step S2 in this manner, the side portion of the metal foil 110 that is separated into the necessary region 110A and the unnecessary region 110B, that is, the edge of the metal foil 110 in a direction orthogonal to the stacked direction is bended toward the base member 20 by pressing the blade 120, becoming the burr 43.

Particularly, in the third embodiment, since the front edge of the blade 120 reaches at least the inside of the adhesive layer 30, the burr 43 is also bended so as to project to the inside of the adhesive layer 30.

Next, the removing step S3 is carried out.

In the removing step S3, the layered structure 205 is wound so as to form a roll so that, for example, the top face (the metal foil side 110) of the layered structure 205 that was subjected to the cutting step S2 is located at an outer circumferential side, and thereby this step is carried out.

Figure 12:
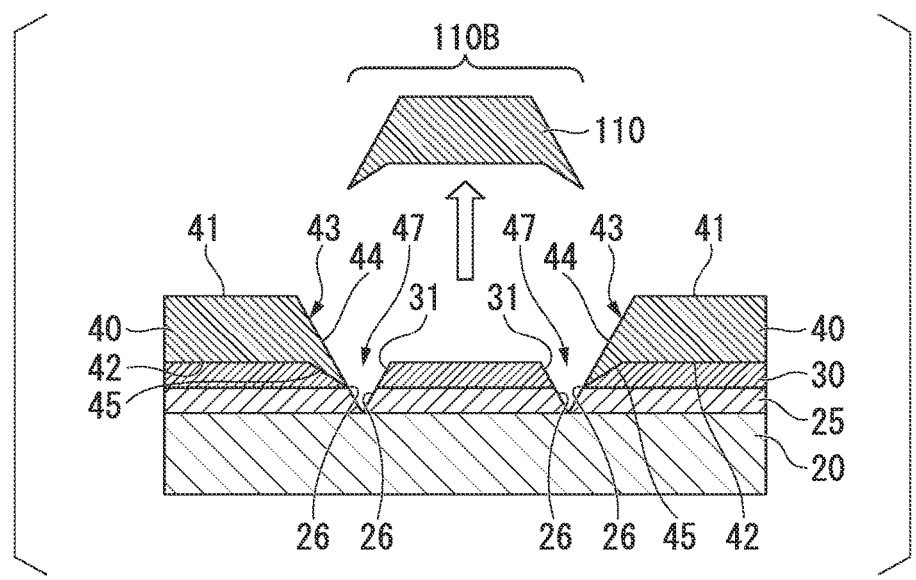
FIG. 12 is a view illustrating a removing step of the third embodiment of the invention.

In this way, as shown in FIG. 12, the unnecessary region 110B of the metal foil 110 is only removed from the adhesive layer 30, and the necessary region 110A of the metal foil 110 only remains as the metal foil pattern 40 on the adhesive layer 30.

Moreover, in order to only remove the unnecessary region 110B of the metal foil 110 in the above-described manner, for example, it is only necessary to make the contact area of the unnecessary region 110B of the metal foil 110 with respect to the adhesive layer 30 smaller than the contact area of the necessary region 110A with respect to the adhesive layer 30, and to suitably adjust the curvature thereof during the roll-shape winding.

Due to the above-described three steps, as shown in FIG. 9, it is possible to obtain the metal foil pattern layered body 210 provided with the metal foil pattern 40 having the burrs 43.

Subsequently, as shown in FIG. 8, the solar cell module 200 is manufactured by use of the metal foil pattern layered body 210.

Firstly, the electrical connectors 70 are formed on the top face 41 of the metal foil pattern 40 of the metal foil pattern layered body 210, and the solar cells 60 are arranged on the metal foil pattern layered body 210 so that electrodes of the solar cells 60 face the electrical connectors 70.

Next, such the metal foil pattern layered body 210, the electrical connectors 70, and the solar cells 60 are externally heated and pressed.

Consequently, the solar cells 60 are mounted onto the metal foil pattern 40 of the metal foil pattern layered body 210.

Subsequently, similar to the above-mentioned embodiments, the solar cells 60 sealed by the seal member 80.

Thereafter, similar to the above-described embodiment, the back sheet 50 is stacked in layers on the back face side of the base member 20, the light-transmissive substrate 90 is integrally fixed to the surface of the seal member 80.

For this reason, as shown in FIG. 8, it is possible to obtain the solar cell module 200 in which the solar cells 60 are electrically connected in series to each other by use of the metal foil pattern 40.

According to the metal foil pattern layered body 210 of the solar cell module 200 in the above-description, since the burrs 43 are formed to project to the inside the adhesive layer 30, and an anchor effect that is due to the burrs 43 and the adhesive layer 30 is produced.

That is, since the entire area of the second inclined surfaces 45 of the burrs 43 is attached firmly to the adhesive layer 30, it is possible to increase the contact area between the metal foil pattern 40 and the adhesive layer 30 as compared with the case of not providing the burrs 43.

Accordingly, it is possible to tightly fix the metal foil pattern 40 to the adhesive layer 30.

As a result, since it is possible to prevent the metal foil pattern 40 from being removed, the metal foil pattern 40 and durability of the solar cell module 200 using the metal foil pattern 40 can be improved.

Moreover, since the buffer layer 25 is formed between the base member 20 and the adhesive layer 30, it is possible to prevent the blade 120 from reaching the top face of the base member 20 during formation of the metal foil pattern 40 by cutting using the blade 120 serving as a die.

Specifically, it is preferable that a cutting depth of the front edge of the blade 120 serving as the die be within the film thickness of the adhesive layer 30.

However, if the thickness of the adhesive layer 30 is small, it is difficult to realize the adjustment thereof, and there is a concern that the front edge of the blade 120 reaches the back face side of the adhesive layer 30.

In contrast, even in the case where the front edge of the blade 120 penetrates through the adhesive layer 30 and comes close to the base member 20, since the buffer layer 25 is interposed the adhesive layer 30 and the base member 20 in the third embodiment, due to providing the buffer layer 25, it is possible to avoid the front edge of the blade 120 from reaching the base member 20.

As a result, it is possible to maintain a high level of the reliability of the product constituted of the metal foil pattern layered body 210 and the solar cell module 200.

Furthermore, in the third embodiment, since the burrs 43 of the metal foil pattern 40 have the first inclined surface 44 that retreats toward the back face side in the direction toward the edge side of the metal foil pattern 40, light with which the top face of the first inclined surface 44 is irradiated can be reflected by the first inclined surface 44.

For this reason, it is possible to allow the light, which passes through the interval between the solar cells 60 adjacent to each other and reaches the first inclined surface 44, to be reflected and to be incident to the solar cells 60.

As a consequence, it is possible to improve light utilization efficiency of the solar cell module 200.

Furthermore, in the solar cell module 200, since an anchor effect that is due to the first inclined surface 44 and the seal member 80 is produced, it is possible to further improve the adhesive strength between the metal foil pattern 40 and the seal member 80.

In addition, in the third embodiment, the cut portion 47 is formed inside the adhesive layer 30 along the first inclined surface 44.

Consequently, in the case where a coated layer formed of the material (other material) which is different from the metal foil pattern layered body is stacked on the top face of the metal foil pattern layered body 210, that is, in the case where the seal member 80 is stacked in layers on the top face of the metal foil pattern layered body 210 when the solar cell module 200 is configured, an anchor effect that is due to the seal member 80 and the cut portion 47 formed in the adhesive layer 30 and the buffer layer 25 is produced.

For this reason, it is possible to tightly fix the seal member 80 to the adhesive layer 30 and the buffer layer 25, and it is possible to further improve the strength of the solar cell module 200.

According to the method of manufacturing the metal foil pattern layered body 210 of the solar cell module 200, the front edge of the blade 120 reaches at least the adhesive layer 30.

Therefore, the edge of the metal foil 110 becoming the cutting portion that is cut by the blade 120 becomes the burr 43, and the burr 43 projects to the base member 20, that is, to the inside of the adhesive layer 30.

By means of this structure, as a result of the anchor effect that is due to the burrs 43 and the adhesive layer 30, it is possible to firmly fix the metal foil pattern 40 to the adhesive layer 30.

The third embodiment of the invention are described above, the technical scope of the invention is not limited to the above embodiments, and various modifications may be made without departing from the scope of the invention.

In the third embodiment, the metal foil pattern layered body 210 is used to connect back contact solar cells 60 to each other as an example; however, it is not limited to such connection structures of the solar cells, and the metal foil pattern layered bodies may be used to electrically connect other packaged devices or electronic parts, or the like.

Fourth Embodiment

Next, a metal foil pattern layered body of a fourth embodiment of the invention used for a solar cell module or the like will be described with reference to FIGS. 13A to 18.

Figure 13A:
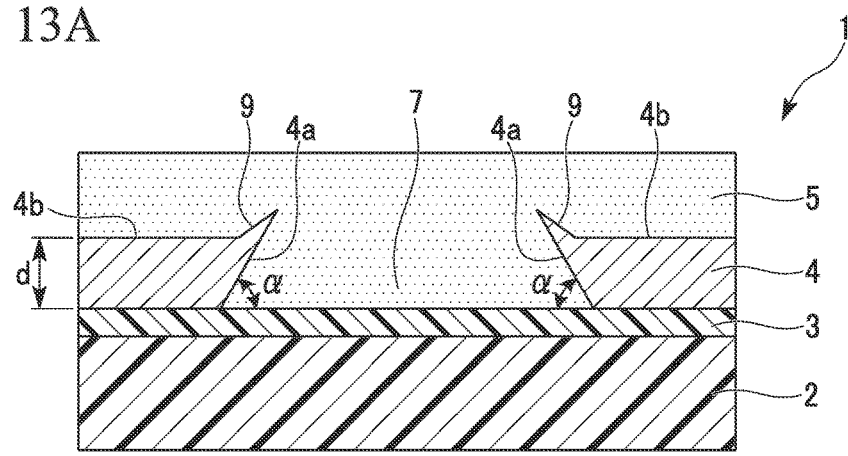
FIG. 13A is a schematic cross-sectional view showing a metal foil pattern layered body of a fourth embodiment of the invention.
Figure 13B:
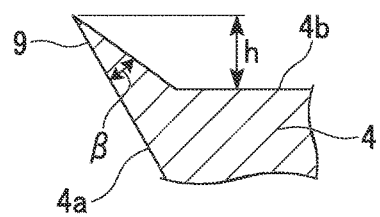
FIG. 13B is a view showing the metal foil pattern layered body of the fourth embodiment of the invention and is an enlarged view showing a protuberance of a metal foil pattern.

A metal foil pattern layered body 1 of the fourth embodiment as shown in FIGS. 13A and 13B is used for and mounted on, for example, a back sheet of a solar cell module.

As a member constituting a solar cell back sheet, a metal foil film having moisture-impermeability or oxygen-impermeability or a composite laminate film constituted of a metal foil film and a resin may be used.

In metal foil pattern layered body 1 of the fourth embodiment, for example, a metal foil 4 on which a predetermined circuit pattern is formed is integrally stacked in layers on the top face of an insulating base member 2 with an adhesive layer 3 interposed therebetween.

A seal member 5 which serves as an insulating layer is stacked on a surface of the metal foil 4 on the opposite side of the adhesive layer 3.

In other cases, an insulating member may separately be provided between the metal foil 4 and the seal member 5.

As such insulating member, for example, solder resist is adopted.

Here, the base member 2 is formed in a film shape or sheet shape.

As a material used to form the base member 2, for example, acryl, polycarbonate, polyethylene terephthalate, polyethylene naphthalate, polyimide, urethane, epoxy, melamine, styrene, or resins in which such materials are copolymerized may be used.

As appropriate, organic or inorganic filler or the like may be introduced into the base member 2 for control of heat insulating property, elasticity, and optical characteristics.

Additionally, in the case of forming a metal foil pattern on the solar cell back sheet, the aforementioned base member 2 may be used as a solar cell back sheet.

In this case, as a member constituting the base member 2, a metal foil film or a composite laminate film constituted of a metal foil film and the aforementioned resins, which has moisture-impermeability or oxygen-impermeability, may be used.

The adhesive layer 3 is formed by heat-curing, for example, urethane, acryl, epoxy, polyimide, and olefin which are thermosetting resins, or a step-curable adhesive in which such materials are copolymerized.

In other cases, as the adhesive layer 3, an adhesive layer which is not step-curable may be used.

Additionally, the seal member 5 is formed of a general seal member, for example, EVA or the like.

The seal member 5 is formed of a seal film or varnish; and varnish is cheaper than the seal film, therefore, preferable.

In the case of using the seal film as the seal member 5, for example, an EVA film, an ethylene (meth) acrylic acid ester copolymer film, a fluoroplastic film such as polyvinylidenefluoride or the like is used.

Figure 18:
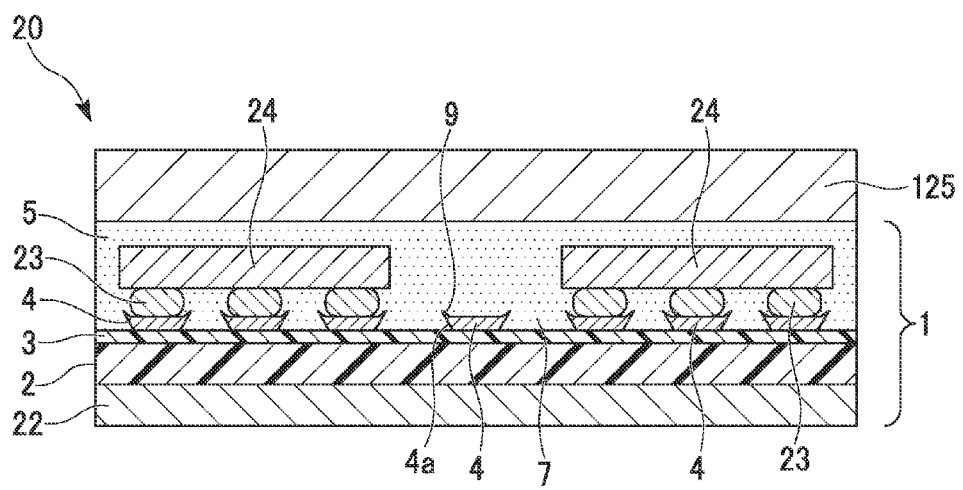
FIG. 18 is a schematic cross-sectional view showing a relevant part of a solar cell module using the metal foil pattern layered body in the fourth embodiment of the invention.

Two or more seal films may be stacked and formed so as to sandwich the solar cells 24 (refer to FIG. 18).

A filler is not introduced into the seal member 5; however, the filler may be introduced thereinto, and an electroconductive filler may be used as the filler which is introduced into the seal member 5.

Next, the configuration of the metal foil 4 will be described with reference to FIGS. 13A and 13B.

Moreover, an electroconductive pattern (metal foil pattern) such as a wiring pattern, a circuit pattern, or the like is formed on the metal foil 4.

Spaces 7, which is cut to as to correspond to the shape of the electroconductive pattern and which is to be filled with the seal member 5, are formed at the metal foil 4.

The cross-sectional configuration of the edge face 4a that is a side face of the metal foil 4 facing the space 7 is an inverse tapered shape (inverse inclined shape).

In FIGS. 13A and 13B, the electroconductive pattern 40 is constituted of openings and metal portions.

The opening is a portion at which the metal foil 4 is partially removed.

The metal portion is a portion which remains on the metal foil pattern 40 after the opening is formed by partially removing the metal foil 4.

In FIG. 13A, the space 7, that is, the portion at which the seal member 5 is in contact with the adhesive layer 3 is the opening, and the metal foil 4 provided on the adhesive layer 3 is the metal portion.

Furthermore, the edge face 4a is provided at the boundary between the opening and the metal portion.

Regarding the inverse tapered shape, an inclined angle α the edge face 4a of the metal foil 4 with respect to the base member 2 (and the adhesive layer 3) is in the range of 55° to 85°.

In the case where the inclined angle α of the inverse tapered edge face 4a is in this range, after the spaces 7 of the metal foil 4 are filled with the seal member 5 and the seal member is cured, it is possible to prevent the seal member 5 from being removed from the metal foil 4.

In contrast, if the inclined angle α is less than 55°, a tool angle of a cutting blade 16a of a die 16 used for forming the edge face 4a of the metal foil 4 by cutting during manufacturing of the metal foil 4 as will be described below is too large to perform smooth cutting.

If the inclined angle α is greater than 85°, since the inclined angle of the edge face 4a is close to a right angle, there is a problem in that the seal member 5 is easily removed.

Since the adhesion force of the seal member 5 with respect to the adhesive layer 3 is lower than the adhesion force with respect to the metal foil 4, when the inclined angle α exceeds 85°, the seal member 5 in particular is easily removed.

In particular, it is desirable that the inclined angle α be in the range of 55° to 75°.

Subsequently, protuberances 9 that protrude along, for example, an extension of the edge face 4a (along an assumed plane along which the edge face 4a extends) is formed at the intersection portion between the edge face 4a of the metal foil 4 and the surface 4b opposite to the adhesive layer 3.

The protuberance 9 is provided at the metal foil 4 and at the boundary between the opening and the metal portion.

Moreover, the protuberance 9 is provided at the edge face 4a and projects to the seal member 5 serving as an insulating layer.

The thickness of the protuberance 9 gradually decreases in the direction from the base of the protuberance 9 to the end thereof, that is, the protuberance 9 has a tapered shape.

In FIGS. 13A and 13B, the protuberance 9 is formed in a triangular shape having an apex at the top in the cross-sectional face; however, the shape of the protuberance 9 is not limited to this shape.

It is not necessarily the case that the protuberance 9 is provided on an extension of the edge face 4a, and the protuberance may be formed at a suitable angle with respect to the edge face 4a.

Here, the apex angle β of the protuberance 9 is in the range defined by $0°<β≤45°$.

In the case where the apex angle β in the aforementioned range, a strong anchor effect with respect to the seal member 5 is obtained, since an excellent effect is obtained that prevents the position of the seal member 5 from being displaced from the position of the metal foil 4 in a horizontal direction which is due to an impact in a lateral direction, the seal member 5 is not removed from the metal foil 4.

Additionally, the height "h" from the top face 4b of the metal foil 4 of the protuberance 9 (height of the metal foil 4 in a vertical direction) is in the range defined by $0°<h≤0.5$ d where the film thickness of the metal foil 4 is "d".

For example, in the case of d=35 μm, the height h is preferably less than or equal to 15 μm.

Furthermore, it is not necessarily the case that the protuberance 9 is provided on an extension of the edge face 4a, and the protuberance may have an inclined angle different from the inclined angle α of the edge face 4a.

In this case, the protuberance 9 can be formed regardless of the height h from the top face 4b of the metal foil 4 to the end of the protuberance 9; however, in order to obtain the impact resistance of the seal member 5 in the lateral direction and to prevent the position thereof from being displaced in the lateral direction, it is preferable that the height h is greater than 0.

Consequently, in the case where the height h is in the range defined by $0°<h≤0.5$ d, excellent anchor effect with respect to the seal member 5 that is stacked in layers on the metal foil 4 is produced.

On the other hand, if the height of the protuberance 9 is less than or equal to 0, a sufficient anchor effect cannot be produced.

In consideration of a material of the metal foil 4 or manufacturing property, it is difficult to form the protuberance 9 having a height h greater than 0.5 d.

In addition, even if the protuberances 9 can be formed under this condition, the rigidity or the strength of the protuberance 9 becomes low.

Consequently, when a detachment stress occurs in the seal member 5, the anchor effect becomes low, an effect is not obtained that prevents removal, and it is thereby undesirable.

The metal foil 4 is formed by cutting a metal sheet by use of the die 16 which will be described below where the metal sheet is made of, for example, copper, aluminum, zinc, iron, nickel, cobalt, alloys made of such materials, or the like.

Moreover, as a material used to form the metal foil 4, a desired metal other than the aforementioned materials may be used.

In consideration of die-cutting by use of a die, it is preferable that the film thickness of the metal foil 4 be 5 μm to 1 mm.

If the film thickness is less than 5 μm, it is difficult to handle the metal foil 4; and if the film thickness exceeds 1 mm, it is difficult to perform die-cutting.

Furthermore, in consideration of durability of die, the film thickness of the metal foil 4 is desirably less than or equal to 200 μm.

Next, a method of manufacturing the metal foil pattern layered body 1 of the fourth embodiment which is provided with the aforementioned constitution will be described with reference to FIGS. 14 to 17.

Figure 14:
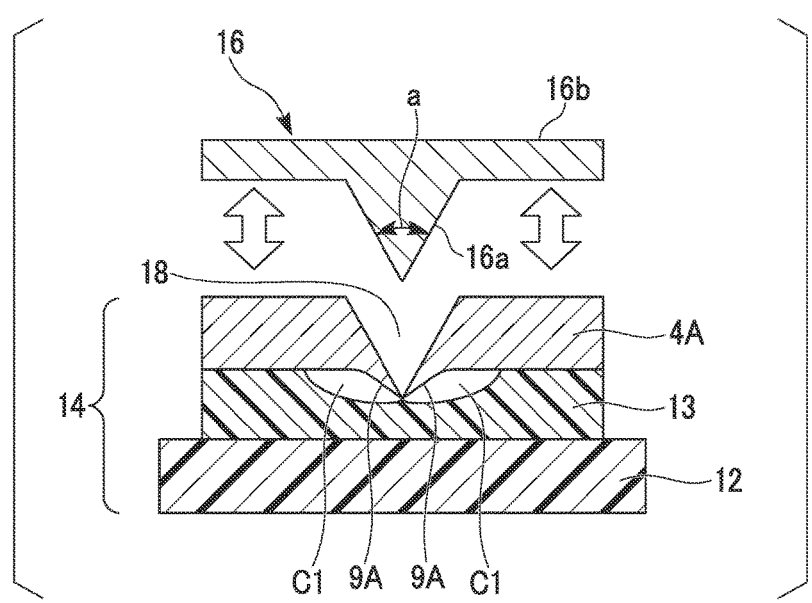
FIG. 14 is a view illustrating a method of manufacturing a metal foil pattern layered body of the fourth embodiment of the invention and is a schematic cross-sectional view showing a state where a notch is formed on a metal foil sheet with a cutting blade of a die.

In FIG. 14, a sheet-shaped metal foil sheet 4A used for forming a circuit pattern is adhesively attached on a stage base member 12 with a self-adhesive film 13 interposed therebetween.

For example, a pinnacle blade, which serves as a cutting blade 16a of the die 16 used for cutting, faces the resultant layered body 14 of the metal foil sheet 4A.

The die 16 has a constitution in which the cutting blade 16a formed in a triangular shape in the cross-sectional face protrudes from a base 16b.

An tool angle a of the cutting blade 16*a* is in the range of, for example, 40° to 60°, and the tool angle a is 50° in the drawing shown as an example.

As the die 16, a corroded die, a cutting die, or the like may be used, and the die 16 is not limited to such dies.

As a material used to form the die 16, glass, a prehardened steel, a quenched and tempered steel, precipitation-hardened steel, an alloy made of tungsten carbide and cobalt, other cemented carbides, or the like may be used, but a material of the die 16 is not limited to such materials.

In the case of die-cutting the metal foil sheet 4A with a high level of precision, a cutting angle a of the cutting blade 16*a* is desirably an acute angle.

The smaller the tool angle a, the smaller the burrs or the like that are formed on the metal foil sheet 4A during cutting; however, the durability of the die 16 is reduced.

Generally, the tool angle a is desirably in the range of approximately 40° to 60°, and the tool angle a is determined so as to properly generate burrs based on the relationship between the metal foil sheet 4A and the tool angle a.

Here, it is possible to form burrs 9A as a result of cutting the metal foil sheet 4A by use of the cutting blade 16*a*.

As a material of the metal foil sheet 4A, for example, copper, aluminum, zinc, iron, nickel, cobalt, alloys made of such materials, or the like is used as described above.

In the case of using copper as a material of the metal foil sheet 4A, burrs occur so that the sheet is split by the cutting blade 16*a*.

Since aluminum is a relatively soft material, the burrs made of this material easily occur and easily deform.

Aluminum is cheaper than copper, and the burrs 9A made thereof is easily deformed.

As compared with aluminum, in the case of using copper, the burrs 9A made thereof, which are formed in a substantially triangle having an acute angle in cross-section face, can be easily formed, and a high level of reliability is thereby obtained.

Next, a method of manufacturing the metal foil pattern layered body 1 of the fourth embodiment will be described.

Firstly, as shown in FIG. 14, the die 16 including the cutting blade 16*a* is placed to face the layered body 14 including the metal foil sheet 4A.

Subsequently, in a cut-forming step, the metal foil sheet 4A is cut as a result of punching the metal foil sheet 4A with the cutting edge of the cutting blade 16*a* in the thickness direction of the layered body 14, the cutting blade 16*a* is pushed into the self-adhesive film 13 so that the cutting edge thereof reaches near the intermediate portion of the self-adhesive film 13, thereafter, cutting is stopped (half-cut-off method).

In this way, the metal foil sheet 4A is cut.

In the half-cut-off method, as a result of pushing the cutting blade 16*a* of the die 16 into (cutting into) the surface of the layered body 14 in the direction from the surface of the layered body 14 to the internal side thereof, when the indentation depth reaches a suitable depth, the cutting is stopped.

For this purpose, the length of the cutting blade 16*a* is adequately determined so that the blade edge of the cutting blade 16*a* cutting the metal foil sheet 4A and being pushed into the inside of the self-adhesive film 13 reaches the position close to the intermediate portion of the self-adhesive film 13 and so that the base 16*b* comes into contact with the top face of the metal foil sheet 4A and cutting is stopped.

Subsequently, the interface between the metal foil sheet 4A and the self-adhesive sheet 13 deforms due to stress occurring at both sides of the cutting edge during the cut-forming by use of the cutting blade 16*a*, and the burrs 9A having, for example, a triangular cross-section are formed so as to correspond to the configuration of the cutting edge.

Furthermore, as a result of the stress occurring at the boundary surface between the metal foil sheet 4A and the self-adhesive sheet 13 along with the formation of the burrs 9A, the bonded surface between the metal foil sheet 4A and the self-adhesive sheet 13 is locally-delaminated, and spaces C1 are thereby formed at both sides of the burrs 9A that are provided by cut-forming with the cutting blade 16*a*.

Figure 15:
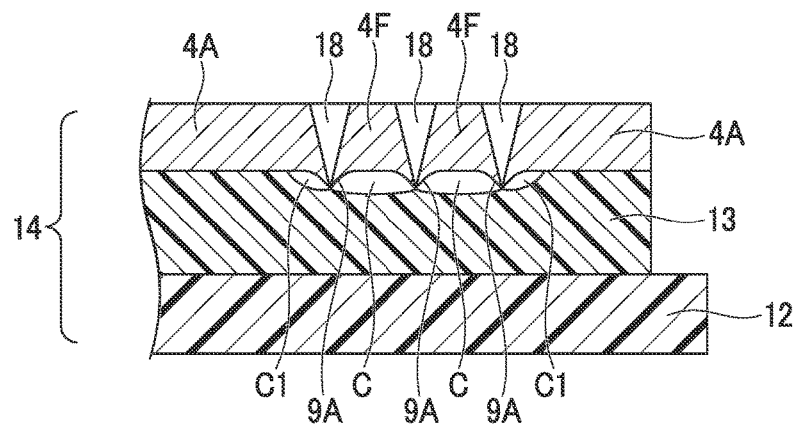
FIG. 15 is a schematic cross-sectional view showing a state where a plurality of notch is formed in order to form a space by removing a part of the metal foil sheet as an unnecessary portion of the metal foil in the fourth embodiment of the invention.

Here, in order to form the spaces 7 inside the metal foil 4, three cut portions 18 are formed at both ends of the space 7 which are to be formed at the metal foil sheet 4A and at the position corresponding to the intermediate portion located between both ends of the space 7 with, for example, three cutting blades 16*a* as shown in FIG. 15.

In this manner, two spaces C1 that are formed between the burrs 9A formed during cut-forming by use of the cutting blade 16*a* are connected to each other, and the connected space grows so as to be a space C having the width that is substantially twice the width of the space C1.

For this reason, an unnecessary portion 4F of the metal foil that is divided by the three cut portions 18 formed on the metal foil sheet 4A and the grown space C is in a removable state.

Figure 16:
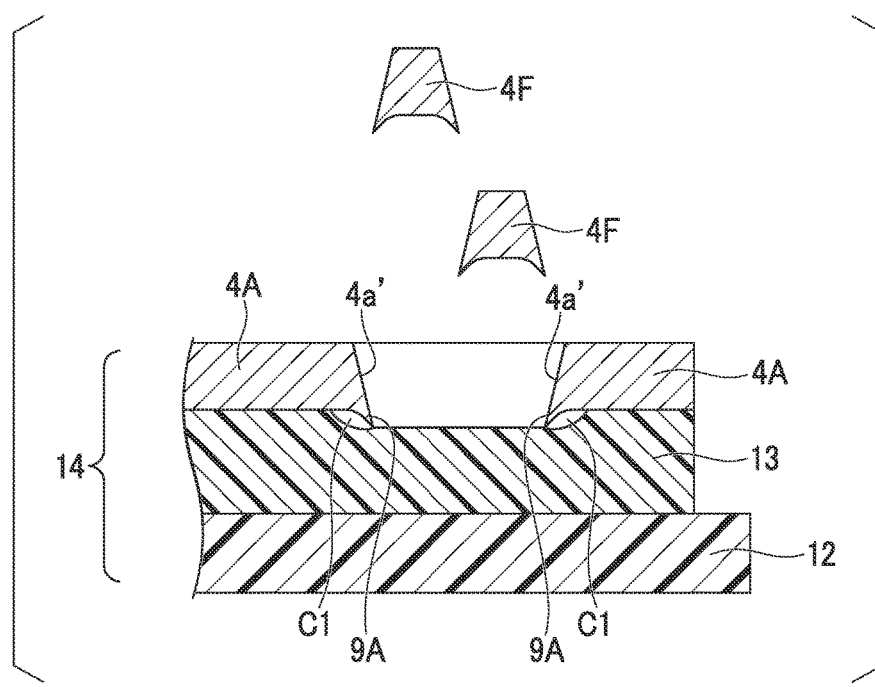
FIG. 16 is a schematic cross-sectional view showing a state where the unnecessary portion of the metal foil is removed from the metal foil sheet in the fourth embodiment of the invention.

Subsequently, as shown in FIG. 16, as a result of separating and removing the unnecessary portion 4F due to the cut portion 18 and the space C, the space 7 is formed at the metal foil sheet 4A, and forward-tapered inclined surfaces, each of which forms the edge face 4*a*' of the metal foil sheet 4A, are formed at both end portions of the space 7, respectively.

The unnecessary portion 4F of the metal foil is separated from the metal foil sheet 4A by forming the space 7 during cutting working as described above, and the metal foil sheet 4A is removed from the self-adhesive sheet 13.

As a result, a metal foil multi-layer substrate is obtained.

The metal foil multi-layer substrate is provided with: the stage base member 12; the self-adhesive film 13 that is provided on the stage base member 12; and the metal foil sheet 4A that is provided on the self-adhesive film 13 and patterned.

Next, the metal foil tape 4A is reversed, and the metal foil sheet 4A is adhesively attached to the surface of a preliminarily-prepared base member 2 with the adhesive layer 3 interposed therebetween.

Figure 17:
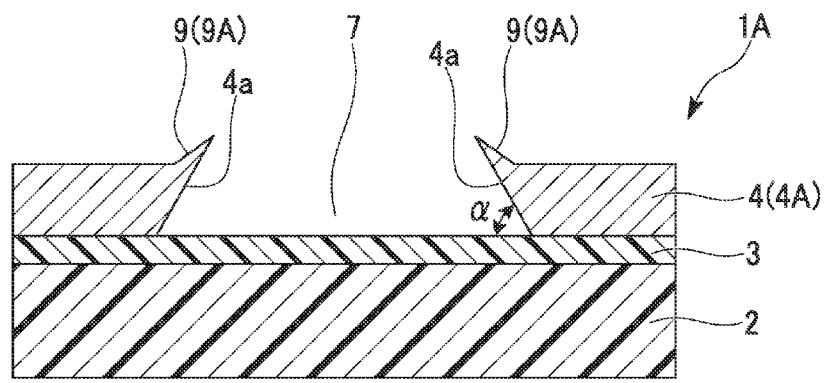
FIG. 17 is a schematic cross-sectional view showing a state where the metal foil flips and adheres to a base member in the fourth embodiment of the invention.

Therefore, as shown in FIG. 17, a metal foil pattern layered body 1A is formed in which the base member 2, the adhesive layer 3, and the metal foil 4 that is the inverted metal foil sheet 4A are stacked in layers.

The metal foil 4 that is located at the uppermost layer constituting the metal foil pattern layered body 1 has inclined surfaces at which edge faces 4*a* facing the space 7 have inverse-tapered shape.

The protuberances 9 are formed such that the burr 9A protrudes along an extension of the edge face 4*a*.

In other words, the protuberances 9 are formed so that the burr 9A protrudes along the edge face 4*a*.

Consequently, as shown in FIG. 17, as a result of stacking the seal member 5 on the metal foil 4 and the adhesive layer 3 in layers such that both the entire surface of the metal foil 4 of the metal foil pattern layered body 1A and the surface of the adhesive layer 3 exposed to the space 7 are coated with the seal member 5, the metal foil pattern layered body 1 shown in FIGS. 13A and 13B can be manufactured.

Next, a solar cell module 20 using the metal foil pattern layered body 1 of the fourth embodiment of the invention shown in FIGS. 13A and 13B will be described with reference to FIG. 18.

In the solar cell module 20 of the fourth embodiment, a back sheet 22 adheres to the base member 2 that is located at the lowermost layer of the aforementioned metal foil pattern layered body 1.

The back sheet 22 adheres to the surface on the opposite side of the face of the base member 2 on which the adhesive layer 3 is provided.

In the back sheet 22, a barrier layer used as a shield member is provided.

As a barrier layer used for the back sheet 22, a metal foil film or a composite laminate film constituted of a metal foil film and a resin material of the base member 2, which has moisture-impermeability or oxygen-impermeability, may be used.

In addition, the metal foil 4 forming a circuit pattern are provided on the adhesive layer 3 of the metal foil pattern layered body 1 at intervals 7.

An electrical connector 23 made of solder, silver paste, or the like is provided on the metal foil 4, the solar cells 24 are placed on such electrical connectors 23, and the electrical connectors 23 are connected to electrodes provided on the back faces of the solar cells 24.

Furthermore, the seal member 5 that seals the solar cells 24 and insulates them from each other is stacked on the metal foil 4 of the metal foil pattern layered body 1 and on the adhesive layer 3.

Moreover, a light-transmissive substrate 125 (light-transmissive front plate) such as glass panel or the like adheres to the surface of the seal member 5.

In the solar cell module 20, also, the edge face 4a of the metal foil 4 has an inverse-tapered inclined angle α.

Additionally, the space 7 that is formed at one of inverse-tapered edge faces or between two inverse-tapered edge faces 4a of the metal foil 4 is filled with the seal member 5, and the seal member is solidified.

Accordingly, it is possible to prevent the cured seal member 5 from being removed or separated from the metal foil 4 or the adhesive layer 3.

Furthermore, since the protuberances 9 constituted of the burr 9A are formed inside the seal member 5 so as to protrude along an extension of the edge face 4a of the metal foil 4, an anchor effect occurs, and it is thereby possible to prevent the seal member 5 from being removed or separated from the metal foil 4.

According to the metal foil pattern layered body 1 of the fourth embodiment as mentioned above, the edge face 4a of the metal foil 4 that forms the space 7 filled with the seal member 5 has the inverse-tapered inclined surface.

For this reason, even where the joint strength between the seal member 5 and the adhesive layer 3 opening at the space 7 is weaker than the joint strength between the seal member 5 and the metal foil 4, it is possible to prevent the seal member 5 from being removed or separated from the metal foil 4 or the adhesive layer 3.

Furthermore, the protuberance 9 protruding along an extension of the edge face 4a is provided on the edge face 4a of the metal foil 4, and the protuberance 9 is implanted in the seal member 5.

Consequently, an anchor effect is produced between the seal member 5 and the edge face 4a having the protuberance 9, and it is possible to further prevent the seal member 5 from being removed or separated from the metal foil 4.

According to the solar cell module 20 including the above-mentioned metal foil pattern layered body 1, similarly, in the metal foil pattern layered body 1 to which the back sheet 22 is connected, a high level of strength of removal resistance between the metal foil 4 and the seal member 5 can be maintained, and it is possible to prevent the seal member 5 from being removed from the metal foil 4.

In other cases, the metal foil pattern layered body 1 of the invention and the solar cell module 20 including this are not limited to the above-mentioned fourth embodiment.

The technical scope of the invention is not limited to the above embodiments, and various modifications may be made without departing from the scope of the invention.

Fifth Embodiment

Next, a metal foil pattern layered body 130 of a fifth embodiment of the invention will be described with reference to FIG. 19.

Figure 19:
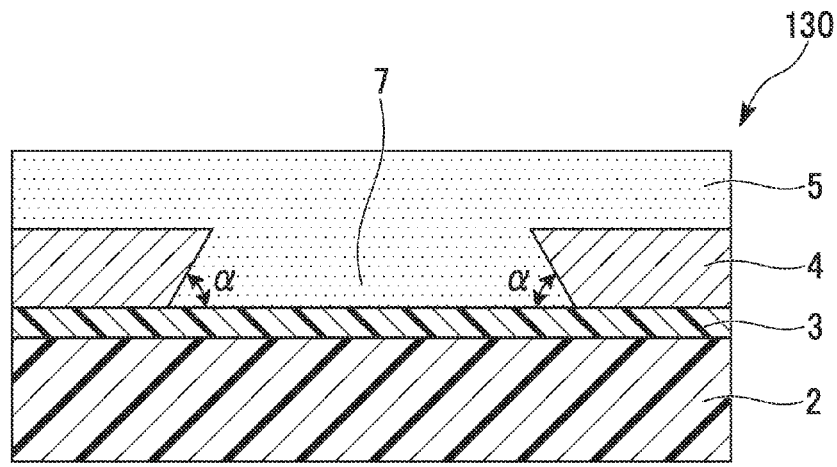
FIG. 19 is a view showing a metal foil pattern layered body of a fifth embodiment of the invention.

The metal foil pattern layered body 130 shown in FIG. 19 is provided with substantially the same configuration as that of the above-mentioned metal foil pattern layered body 1 of the fourth embodiment, and the fifth embodiment is different from the fourth embodiment in that the protuberances 9 are not provided on the metal foil 4.

Particularly, even where the burrs 9A are formed by cutting the metal foil sheet 4A with the cutting blade 16a of the die 16 during manufacturing of the metal foil pattern layered body 130 of the fifth embodiment, the surface of the metal foil sheet 4A can be flat by coining.

Alternatively, as a result of winding the metal foil sheet where the unnecessary portion 4F of the metal foil is separated and removed from the metal foil sheet by cutting the metal foil sheet 4A with the cutting blade 16a of the die 16, it is possible to planarize the surface of the metal foil sheet 4A on which the burrs 9A are caused by the generated pressure in the metal foil sheet 4A during the winding.

Alternatively, the burrs 9A may be removed.

In the metal foil pattern layered body 130 of the fifth embodiment, since the inverse-tapered inclined surface is also provided on the edge face 4a of the metal foil 4 on which the space 7 filled with the seal member 5 is formed, it is possible to prevent the seal member 5 from being removed or separated from the metal foil 4 or the adhesive layer 3.

Moreover, in each of the aforementioned fourth and fifth embodiments, the inverse tapered inclined surface is formed on the edge faces 4a of the metal foil 4 which are located at both sides of the space 7 and which form the space 7 in the metal foil pattern layered bodies 1 and 130.

Furthermore, the angle of inclined surface with respect to the base member is the inclined angle α.

In the invention, it is not necessarily the case that the shape of the edge faces 4a located at both sides of the space 7 are formed in an inverse tapered shape, and it is only necessary for at least one-side edge face 4a to have an inverse tapered shape having the inclined angle α.

Additionally, regarding the protuberances 9 that are formed at the edge faces 4a of the metal foil 4, it is only necessary to form the protuberance 9 on at least one of the edge faces 4a.

Particularly, the seal member 5 used for each of the aforementioned fourth and fifth embodiment is an insulating layer; in the case where the seal member 5 is used in the solar cell module 20, the seal member 5 is used to stabilize the solar cells 24 that are positionally-fixed in the solar cell module 20 or to serve as an insulating member.

Additionally, the metal foil layered bodies 1 and 130 of the fourth embodiment of the invention and the fifth embodiment are limited to be used for the solar cell module 20.

In other cases, the metal foil pattern layered body of the invention may be realized by stacking an insulating layers such as the seal member 5 or the like on the metal foil 4 forming various electroconductive patterns such as an antenna of an integrated circuit tag, an electrical conductor, a wiring pattern, a circuit pattern, or the like.

The metal foil pattern layered bodies 1 and 130 of the invention on which an insulating layer, for example, the seal member 5 or the like is stacked are optionally applied to the intended use.

Sixth Embodiment

Next, a metal foil layered body of a sixth embodiment of the invention used for a solar cell module or the like will be described with reference to FIGS. 20 to 25.

In the sixth embodiment, identical symbols are used for the elements which are identical to those of the fourth embodiment and the fifth embodiment, and the explanations thereof are omitted or simplified here.

Figure 20:
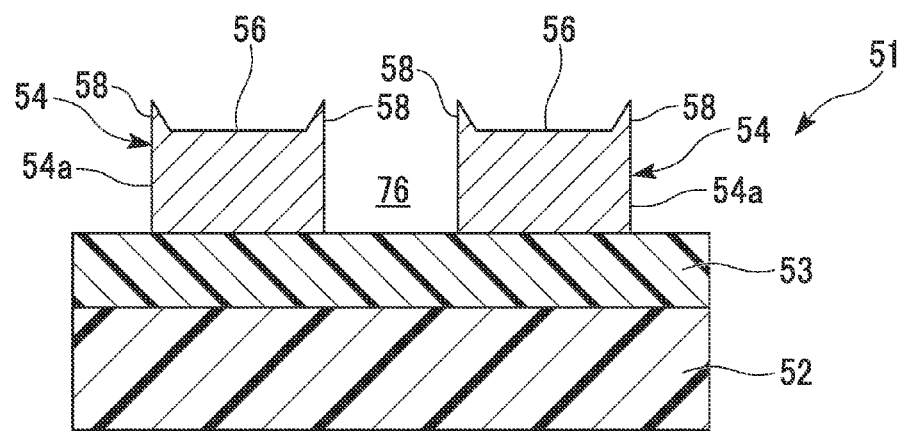
FIG. 20 is a schematic cross-sectional view showing a metal foil layered body of a sixth embodiment of the invention.

A metal foil pattern layered body 51 of the sixth embodiment as shown in FIG. 20 is used for and mounted on, for example, a back sheet of a solar cell module.

As a member constituting this back sheet, an aluminum foil film or a composite laminate film constituted of an aluminum foil film and a resin, which has moisture-impermeability or oxygen-impermeability, may be used.

In metal foil pattern layered body 51 of the sixth embodiment, for example, a metal foil 54 on which a predetermined wiring pattern is formed is integrally stacked in layers on the top face of an insulating base member 52 with an adhesive layer 53 interposed therebetween.

As a material of the base member 52, the same material as that in the aforementioned fourth embodiment is used.

Additionally, in the case of forming a wiring pattern on the solar cell back sheet, the aforementioned base member 52 may be used as a solar cell back sheet.

In this case, as a member constituting the base member 52, an aluminum foil film or a composite laminate film constituted of an aluminum foil film and the aforementioned resins, which has moisture-impermeability or oxygen-impermeability, may be used.

As a material used to form the adhesive layer 53, the same material as that in the aforementioned fourth embodiment is used.

Next, a constitution of the metal foil 54 will be described.

The metal foil 54 has a wiring pattern which is divided by spaces 76.

Electroconductive paste such as solder paste, silver paste, or the like is mounted on an upper face region 56 of the metal foil 54, and the upper face region 56 is connected through the electroconductive paste to an electrode which is provided on the back face of a solar cell 63 described below.

Figure 21:
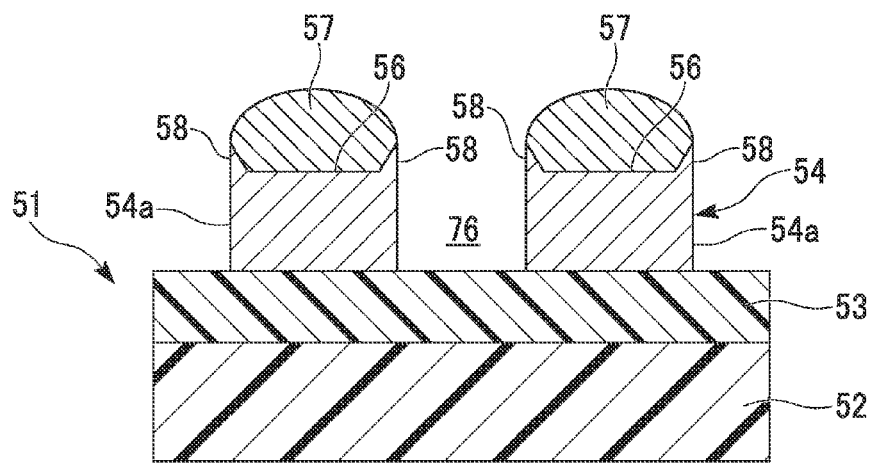
FIG. 21 is a schematic cross-sectional view showing a state where a molten solder is blocked on an upper face region of the metal foil of the metal foil layered body shown in FIG. 20 in the sixth embodiment of the invention.

In the examples shown in FIGS. 20 and 21, solder 57 is mounted on the upper face region 56.

Moreover, a protuberance 58 is formed along an extension of side faces 54a (on an assumed plane extending from the side face 54a) surrounding the upper face region 56 of the metal foil 54.

As shown in FIG. 21, the protuberances 58 rise from the upper face region 56 and block (surround) hot-melt solder 57 so that the solder 57 having flowability does not leak out toward the periphery of the metal foil 54.

It is preferable to form the protuberance 58 around the side face 54a of the metal foil 54, but it is not necessary to form it around the side face.

Even where a gap is provided between the protuberances 58, the surface tension of the molten solder 57 occurs, and it is possible to prevent the molten solder from leaking.

Consequently, the protuberance 58 of the metal foil 54 shown in FIG. 20 is formed in a triangular shape having an apex at the top in the cross-sectional face; however, the shape of the protuberance 58 is not limited to this shape.

It is not necessarily the case that the protuberance 58 is provided on an extension of the side face 54a.

It is possible to form the protuberance 58 so as to have suitable angle with respect to the side face 54a.

In particular, the metal foil 54 is formed by cutting a metal sheet by use of a cutting blade 73 of a die 72 which will be described below where the metal sheet is made of, for example, aluminum; copper, zinc, iron, nickel, cobalt; alloys made of such materials; or the like.

Since aluminum is softer than the other metal and has a high degree of stickiness, large burrs are generated when an aluminum foil is used as the metal foil 54 and die-cutting is carried out by cutting the aluminum foil with the cutting blade 73 of the die 72; and therefore, since a large protuberance 58 formed of the burr can be formed, it is preferable.

As shown in FIG. 21, a large amount of paste having flowability and forming the solder 57 used for connection can be held by the protuberances 58 formed of the burr on the upper face region 56.

Accordingly, it is possible to prevent the wiring pattern of the metal foil 54 adjacent to each other from being electrically conducted and from being short-circuited which is due to fluidic paste leaking from the upper face region 56 and drops downward.

Next, a solar cell module 61 using the metal foil layered body 51 of the sixth embodiment of the invention shown in FIG. 20 will be described with reference to FIG. 22.

In the solar cell module 61 of the sixth embodiment, a back sheet 62 adheres to the base member 52 that is located at the lowermost layer of the aforementioned metal foil layered body 51.

The back sheet 62 adheres to the surface on the opposite side of the face of the base member 52 on which the adhesive layer 53 is provided.

In the back sheet 62, a barrier layer used as a shield member is provided.

As a barrier layer used for the back sheet 62, an aluminum foil film or a composite laminate film constituted of an aluminum foil film and a resin material of the base member 52, which has moisture-impermeability or oxygen-impermeability, may be used.

Additionally, the metal foil 54 forming a wiring pattern are provided on the adhesive layer 53 of the metal foil layered body 51 at intervals 76.

Solder 57 serving as an electroconductive member is placed on the upper face region 56 of the metal foil 54, the solar cell 63 is placed on the solder 57, and the solder 57 is connected to an electrode provided on the back face of the solar cell 63.

Moreover, a seal member 64 that seals and insulates the solar cells 63 from each other and is made of, for example, an EVA film is stacked in layers on the metal foil 54 and the adhesive layer 53 of the metal foil layered body 51.

Moreover, a light-transmissive substrate 65 such as glass panel or the like adheres to the surface of the seal member 64.

The seal member 64 may have a constitution in which two or more EVA films are stacked in layers so as to sandwich the solar cells 63.

Figure 22:
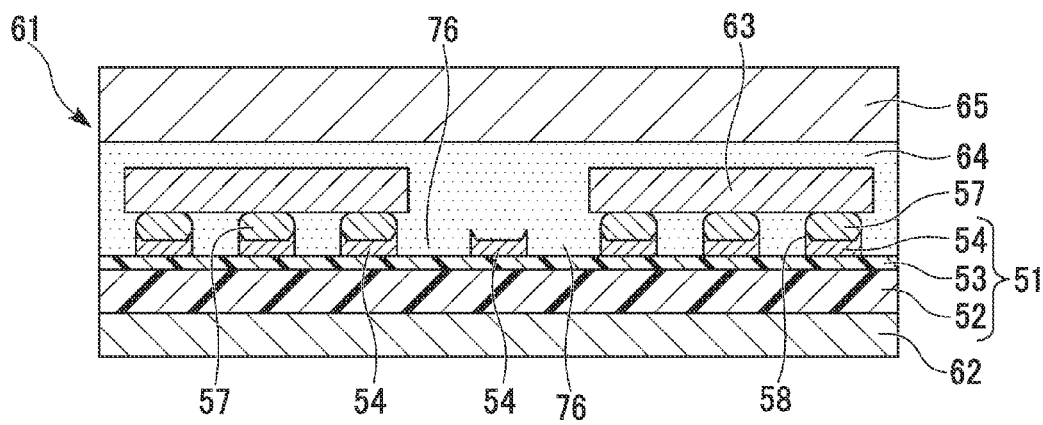
FIG. 22 is a schematic cross-sectional view showing a relevant part of a solar cell module using the metal foil layered body in the sixth embodiment of the invention.

When the solar cell module 61 is assembled, in FIG. 22, the solder 57 is melted by heating while being mounted on the upper face region 56 of the metal foil 54 of the metal foil layered body 51, alternatively melting and heated solder 57 falls in drops on the upper face region 56 of the metal foil 54.

In this condition, the molten solder 57 is blocked by the protuberances 58 provided around the upper face region 56 on the upper face region 56 of the metal foil 54, the molten solder 57 is accumulated on the upper face region 56 so as to rise therefrom, and it is possible to prevent the molten solder 57 from leaking from the protuberances 58.

For this reason, on the inside region that is surrounded by the protuberance 58 of the metal foil 54, a state where the solder 57 rises therefrom by the action of surface tension is maintained, and the electrodes provided on the back faces of the solar cells 63 are mounted on the solders 57; as a result of cooling the solder 57, the wiring pattern of the metal foil 54 and the electrodes provided on the back face of the solar cell 63 are in an electroconductive state, and the solar cells 63 are fixed to the inside of the solar cell module 61.

Next, a method of manufacturing the metal foil pattern layered body 51 of the sixth embodiment which is provided with the aforementioned constitution will be described with reference to FIGS. 23 to 25.

Figure 23:
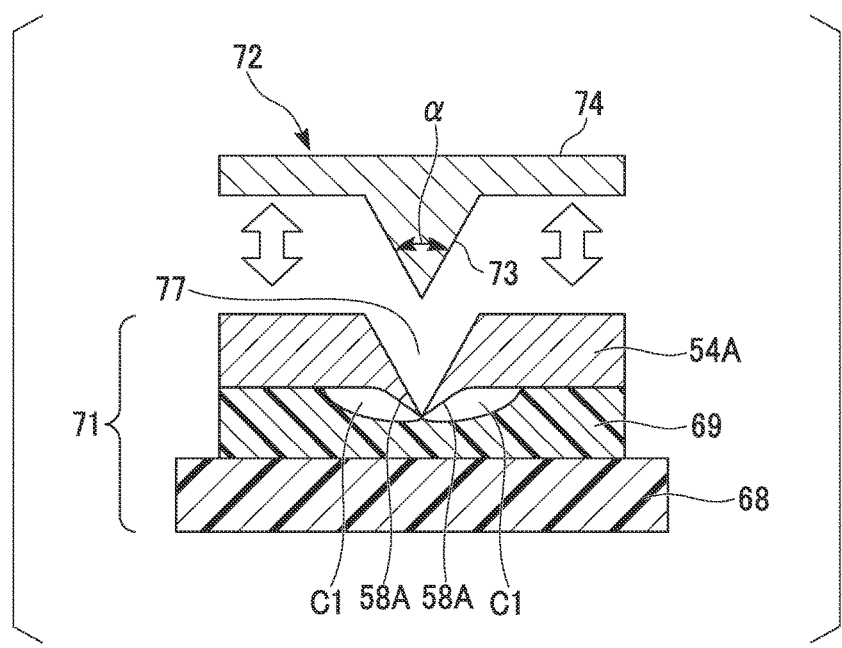
FIG. 23 is a view illustrating a method of manufacturing a metal foil layered body of the sixth embodiment of the invention and is a schematic cross-sectional view showing a state where a notch is formed on a metal foil sheet with a cutting blade of a die.

In FIG. 23, a sheet-shaped metal foil sheet 54A used for forming a wiring pattern is adhesively attached on a stage base member 68 with a self-adhesive film 69 interposed therebetween.

For example, a pinnacle blade, which serves as a cutting blade 73 of the die 72 used for cutting, faces the resultant layered body 71 of the metal foil sheet 54A.

The die 72 has a constitution in which the cutting blade 73 formed in a triangular in the cross-sectional face protrudes from a base 74.

An tool angle α of the cutting blade 73 is in the range of, for example, 40° to 60°, and the tool angle α is 50° in the drawing shown as an example.

As the die 72, a corroded die, a cutting die, or the like may be used, and the die 72 is not limited to such dies.

As a material used to form the die 72, glass, a prehardened steel, a quenched and tempered steel, precipitation-hardened steel, an alloy made of tungsten carbide and cobalt, other cemented carbides, or the like may be used, but the material of the die 72 is not limited to such materials.

In the case of die-cutting the metal foil sheet 54A with a high level of precision, the cutting angle α of the cutting blade 73 is preferably an acute angle.

The smaller the tool angle α, the smaller the burrs or the like that are formed on the metal foil sheet 54A during cutting; however, the durability of the die 72 is reduced.

Generally, the tool angle α is desirably in the range of approximately 40° to 60°, and the tool angle α is determined so as to properly generate burrs based on the relationship between the metal foil sheet 54A and the tool angle α.

In FIG. 23, it is possible to form burrs 58A as a result of cutting the metal foil sheet 54A by use of the cutting blade 73.

Copper is a material relatively having rigidity, if copper is used as a material of the metal foil sheet 54A, burrs occur so that the metal foil sheet 54A is split.

Additionally, aluminum alloys are a relatively soft material, if aluminum alloys are used as the metal foil sheet 54A, the burrs 58A easily occur and the burrs 58A easily grow.

Since aluminum is cheaper than copper and significantly large burrs 58A are easily formed, the height of the protuberance 58 formed of the burr 58A (height from the upper face region 56 in the vertical direction) is high, the solder 57 can be maintained thereby, and it is possible to increase the fluid volume of the accumulated solder 57.

In the sixth embodiment, as a result of using aluminum as the metal foil sheet 54A, it is possible to form the burr 58A having a long length, and it is possible to maintain the solder 57 having a relatively large amount on the upper face region 56 of the metal foil 54.

Next, a method of forming the protuberances 58 on the metal foil 54 will be described.

Firstly, as shown in FIG. 23, the die 72 including the cutting blade 73 is placed to face the layered body 71 including the metal foil sheet 54A.

Subsequently, in a cut-forming step, the metal foil sheet 54A is cut as a result of punching the metal foil sheet 54A with the cutting edge of the cutting blade 73 of the die 72 in the thickness direction of the layered body 71, the cutting blade 73 is pushed into the self-adhesive film 69 so that the cutting edge thereof reaches near the intermediate portion of the self-adhesive film 69, thereafter, cutting is stopped (half-cut-off method).

In this way, the metal foil sheet 54A is cut.

In the half-cut-off method, as a result of pushing the cutting blade 73 of the die 72 into (cutting into) the surface of the layered body 71 in the direction from the surface of the layered body 71 to the internal side thereof, when the indentation depth reaches a suitable depth, the cutting is stopped.

For this purpose, the length of the cutting blade 73 is adequately determined so that the blade edge of the cutting blade 73 cutting the metal foil sheet 54A and being pushed into the inside of the self-adhesive film 69 reaches the position close to the intermediate portion of the self-adhesive film 69 and so that the base 74 comes into contact with the top face of the metal foil sheet 54A and cutting is stopped.

Subsequently, the interface between the metal foil sheet 54A and the self-adhesive sheet 69 deforms due to stress occurring at both sides of the cutting edge during the cut-forming by the cutting blade 73, and the burrs 58A having, for example, a triangular cross-section are formed so as to correspond to the configuration of the cutting edge.

Furthermore, as a result of the stress occurring at the boundary surface between the metal foil sheet 54A and the self-adhesive sheet 69 along with the formation of the burrs 58A, the bonded surface between the metal foil sheet 54A and the self-adhesive sheet 69 is locally-delaminated, and spaces C1 are thereby formed at both sides of the burrs 58A that are provided by cut-forming with the cutting blade 73.

Figure 24:
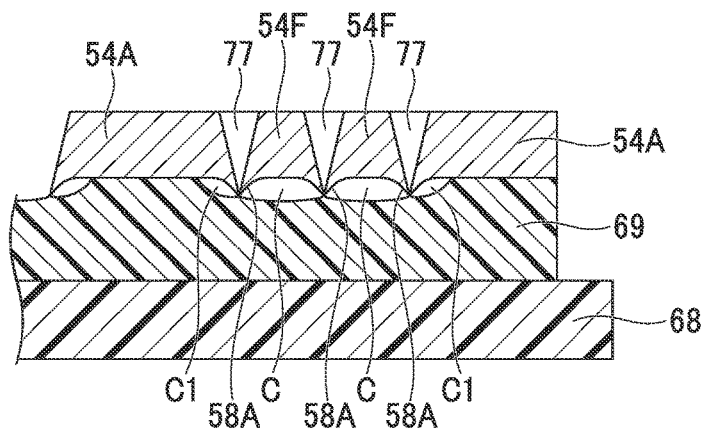
FIG. 24 is a schematic cross-sectional view showing a state where a plurality of notch is formed in order to form a space by removing a part of the metal foil sheet as an unnecessary portion of the metal foil in the sixth embodiment of the invention.

Here, in order to form the space 76 dividing a wiring pattern formed of the metal foil 54, three cut portions 77 are formed at both ends of the space 76 which are to be formed at the metal foil sheet 54A and at the position corresponding to the intermediate portion located between both ends of the space 76 with, for example, three cutting blades 73 as shown in FIG. 24.

In this manner, two spaces C1 that are formed between the burrs 58A formed during cut-forming by use of the cutting blade 73 are connected to each other, and the connected space grows so as to be a space C having the width that is substantially twice the width of the space C1.

For this reason, an unnecessary portion 54F of the metal foil that is divided by the three cut portions 77 formed on the metal foil sheet 54A and the grown space C is in a removable state.

Figure 25:
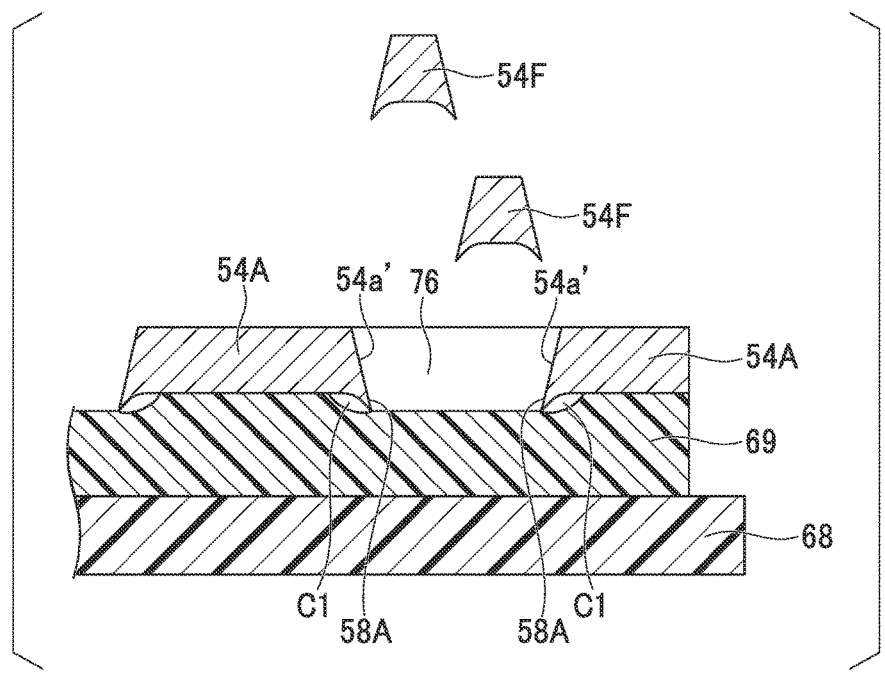
FIG. 25 is a schematic cross-sectional view showing a state where the unnecessary portion of the metal foil is removed from the metal foil sheet in the sixth embodiment of the invention.

Subsequently, as shown in FIG. 25, as a result of separating and removing the unnecessary portion of the metal foil 54F due to the cut portion 77 and the space C, the space 76 is formed at the metal foil sheet 54A, and the burrs 58A formed at the side face 54a' and the side face 54a' of the metal foil sheet 54A are formed at both end portions of the space 76.

The unnecessary portion 4F of the metal foil is separated from the metal foil sheet 4A by forming the space 76 during cutting working as described above, and the metal foil sheet 54A having the side face 54a' on which the burr 58A is formed is removed from the self-adhesive sheet 69.

As a result, a metal foil multi-layer substrate is obtained.

The metal foil multi-layer substrate is provided with: the stage base member 68; the self-adhesive film 69 that is provided on the stage base member 68; and the metal foil sheet 54A that is provided on the self-adhesive film 69 and patterned.

Next, the metal foil sheet 54A is reversed, and the metal foil sheet 54A is adhesively attached to the surface of a preliminarily-prepared base member 52 with the adhesive layer 53 interposed therebetween.

Therefore, as shown in FIG. 20, a metal foil layered body 51 is formed in which the base member 52, the adhesive layer 53, and the metal foil 54 that is the inverted metal foil sheet 54A are stacked in layers.

In the metal foil 54 that is located at the uppermost layer constituting the metal foil layered body 51, the wiring pattern thereof is divided by the space 76.

The metal foil 54 forming each wiring pattern has the upper face region 56, the side face 54a, and the protuberance 58 that is formed of the burr 58A and protrudes along an extension of the side face.

In the above-described manner, the metal foil layered body 51 can be manufactured.

In the above-description, according to the metal foil layered body 51 of the sixth embodiment, the protuberance 58 formed of the burr 58A is provided around the upper face region 56 of the metal foil 54 having a wiring pattern on which the solder 57 is to be provided.

With this configuration, when the solder 57 is maintained on the upper face region 56 of the metal foil 54 in a state where the melting and heated solder 57 has flowability during connection, the solders 57 are blocked by the protuberances 58 rising from the upper face region 56, and it is possible to prevent the melting and heated solder 57 from leaking to the periphery of the metal foil 54.

Because of this, it is possible to reliably connect solders 57 to electrodes or wirings of members such as a solar cell 63 or the like without short-circuiting between the wiring patterns adjacent to each other and the metal foil 54 or the like.

Furthermore, according to the solar cell module 61 of the sixth embodiment, the protuberance 58 is provided around the upper face region 56 of the periphery of the metal foil 54 having a wiring pattern, and the solder 57 is mounted on the upper face region 56.

For this reason, even where the solder 57 has flowability due to heating during connection, the solder 57 is blocked by the protuberance 58, and the solder 57 is held by the action of surface tension so as to rise from the upper face region 56.

As a result, wirings or the like adjacent to each other are not short-circuited, and it is possible to reliably connect them to the electrodes of the solar cells 63.

In other cases, the metal foil layered body 51 of the invention and the solar cell module 61 including the metal foil layered body 51 are not limited to the aforementioned sixth embodiment.

The technical scope of the invention is not limited to the above embodiments, and various modifications may be made without departing from the scope of the invention.

In the above-mentioned sixth embodiment, the solder 57 serving as an electroconductive member used to connect the metal foil 54 having a wiring pattern to the electrode of the solar cell 63 is provided, but the present invention is not limited to such solder 57, and an electroconductive member having suitable fusibility such as silver paste or the like may be used.

Additionally, in the above-described the metal foil layered body 51 of the sixth embodiment, a sheet-shaped adhesive layer 53 is stacked on the base member 52, and the metal foil 54 that is arranged and divided by the space 76 so as to correspond to the shape of the wiring pattern is formed on the adhesive layer 53.

Instead of this configuration, similar to the wiring pattern of the metal foil 54, the adhesive layer 53 may be divided by the space 76 and the adhesive layer 53 may be stacked on the base member 52.

Furthermore, in the above-mentioned sixth embodiment, by cutting the metal foil sheet 54A with the cutting blade 73 of the die 72, the metal foil 54 that is formed along the wiring pattern is arrayed on the adhesive layer 53.

The metal foil 54 has the pattern divided by the space 76.

For this reason, as shown in FIGS. 20 and 21, the side face 54a of the metal foil 54 is formed substantially perpendicular to the base member 52.

In other cases, the side face 54a of the metal foil 54 may not formed substantially perpendicular to the base member 52.

Figure 26:
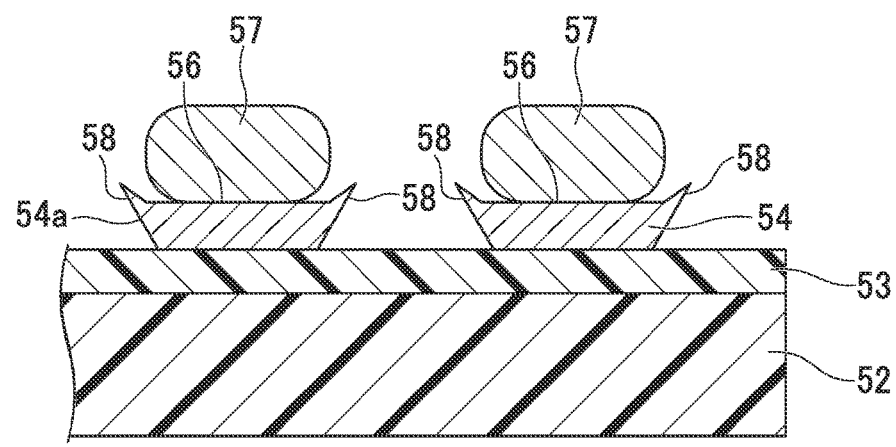
FIG. 26 is a schematic cross-sectional view showing a relevant part of a metal foil layered body, on which solder is mounted, of a modified example of the sixth embodiment of the invention.
Figure 27:
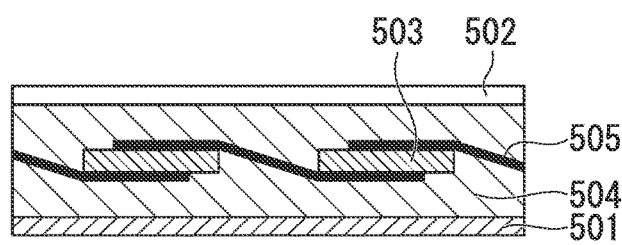
FIG. 27 is a vertical cross-sectional view showing a conventional solar cell module.
Figure 28:
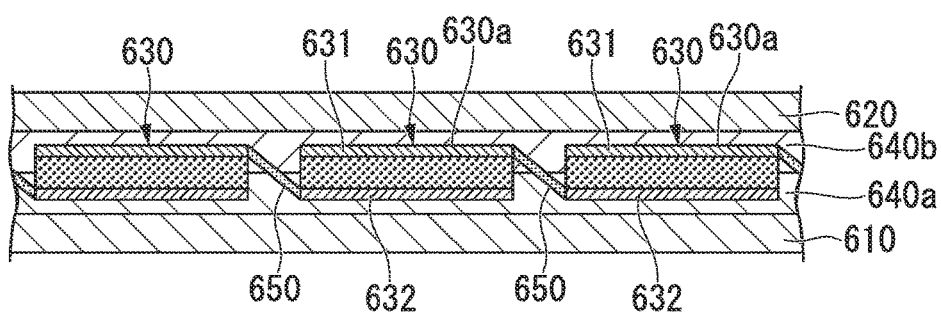
FIG. 28 is a schematic cross-sectional view showing a circuit pattern of a conventional solar cell back sheet.
Figure 29:
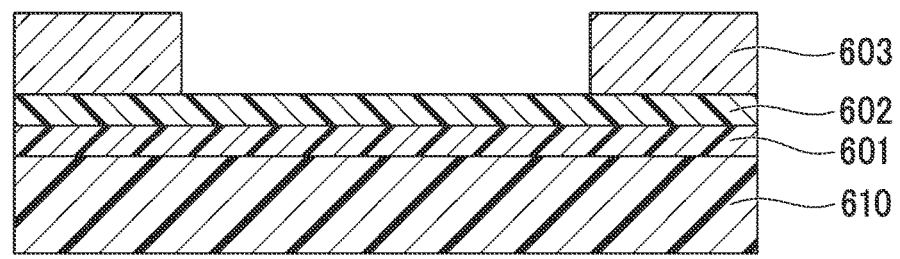
FIG. 29 is a schematic cross-sectional view showing the relevant configuration of a conventional solar cell module.
Figure 30:
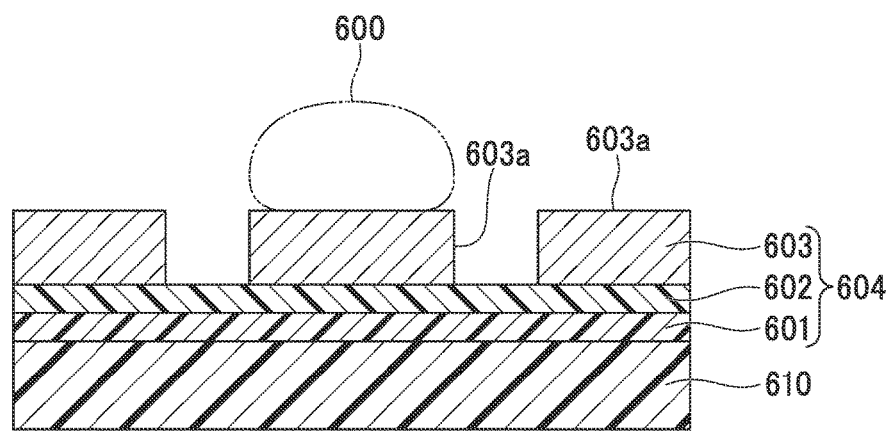
FIG. 30 is a schematic cross-sectional view showing a wiring pattern provided on a conventional solar cell back sheet.

For example, as illustrated in a modified example of the sixth embodiment shown FIG. 26, the shape of the side face 54a of the metal foil 54 may be an inverse tapered shape formed along the insection of the cutting blade 73.

In this case, the protuberance 58 formed of the burr 58A has an inverse tapered shape which is inclined to widen outwardly in the upper vertical direction of the metal foil 54.

Consequently, the surface area of the upper face region 56 surrounded by the protuberance 58 increases, the capacity of the metal foil 54 accommodating the solder 57 increases, and the reliability and the joint strength of connection between the electrode or the like of the solar cell 63 and the metal foil 54 are improved.

In particular, in the metal foil 54 of the aforementioned modified example, the inclined surface having an inverse tapered shape is formed on the side face 54a of the metal foil 54, and the angle of the side face 54a with respect to the adhesive layer 53 is a sharp angle.

It is not necessarily the case that the shape of both side face 54a is an inverse tapered shape, a suitable shape such as a forward tapered shape or the like may be adopted.

Additionally, the metal foil layered body 51 of the sixth embodiment of the invention is limited to be used for the solar cell module 61.

In other cases, as the metal foil 54 forming various electroconductive patterns such as an antenna of an integrated circuit tag, an electrical conductor, a circuit pattern, or the like, the above-mentioned metal foil layered body may be used.

The metal foil layered body 51 of the invention is utilized to any intended use.

INDUSTRIAL APPLICABILITY

The invention is widely applicable to a metal foil pattern layered body, a metal foil layered body, a metal foil multilayer substrate, solar a cell module, and a method of manufacturing a metal foil pattern layered body.

What is claimed is:

1. A back sheet for a solar cell module, the back sheet comprising a metal foil pattern layered body comprised of:
a base member having a top surface;
an adhesive layer disposed above the top surface of the base member; and
a metal foil, wherein the metal foil comprises:
a metal foil pattern having a metal portion and an opening formed in the metal portion, the metal portion of the metal foil pattern having a top face, a back face and a side portion and being stacked on the base member with the adhesive layer interposed between the back face of the metal foil portion and the top surface of the base member, and
(ii) a protuberance protruding from the side portion of the metal foil into the adhesive layer, the protuberance being made of the same material as that of the metal foil and being provided at a boundary between the opening and the metal portion, wherein
the protuberance includes a first inclined surface extending from the top face of the metal portion toward the top surface of the base member, and a second inclined surface extending from the bottom face of the metal portion toward the base member in contact with the adhesive layer, the first and second inclined surfaces terminating at an edge of a front-end portion which is positioned at a boundary surface between the adhesive layer and the base member, and wherein
the adhesive layer includes an adhesive-layer inclined surface which is spaced from and oppositely faces the first inclined surface of the protuberance so as to define a substantially V-shaped cross-sectional space between the adhesive-layer inclined surface and the first inclined surface of the protuberance thereby providing a cut portion of the adhesive layer.

2. The back sheet according to claim 1, wherein the protuberance is bent in a direction toward the base member and formed in the adhesive layer.

3. The back sheet according to claim 2, wherein the adhesive layer is disposed on the top surface of the base member.

4. The back sheet according to claim 2, further comprising a buffer layer disposed between the base member and the adhesive layer, wherein the adhesive layer is disposed on the buffer layer, and
the metal foil pattern is stacked on the base member with the adhesive layer interposed therebetween, the adhesive layer being disposed on the buffer layer.

5. The back sheet according to claim 1, wherein the cut portion is continuously formed at the adhesive layer and the base member.

6. The back sheet claim 4, wherein the buffer layer is a PET film.

7. A solar cell module comprising:
a plurality of solar cells;
a seal layer sealing the solar cells and having a back face side; and
the back sheet according to claim 1 disposed at the back face side of the seal layer, the back sheet electrically connecting the solar cells to each other.

8. The back sheet according to claim 1, wherein the metal foil pattern layered body further comprises an insulating layer coating the metal foil, wherein
the adhesive layer is provided on one face of the base member,
the metal foil pattern is an electroconductive pattern provided on the base member with the adhesive layer interposed therebetween,
the metal foil has an inclined edge face having an inverse tapered shape, and
the protuberance is provided at the edge face and projects to the insulating layer.

9. The back sheet according to claim 8, wherein
a cross-sectional shape of the protuberance is substantially triangular, and
the protuberance protrudes from the edge face on an extension of the edge face of the metal foil.

10. The back sheet according to claim 8, wherein an inclination angle of the edge face of the metal foil with respect to the base member is in the range of 55° to 85°.

11. A solar cell module comprising:
the back sheet metal foil pattern layered body according to claim 8, wherein the metal foil includes a circuit pattern;
a solar cell sealed inside the insulating layer; and
a light-transmissive front plate stacked on a face on the opposite side of the face of the insulating layer on which the metal foil is provided.

12. The back sheet according to claim 1, wherein the adhesive-layer inclined surface and the first inclined surface of the protuberance intersect one another at the top surface of the base member.

* * * * *